United States Patent
Ando et al.

(10) Patent No.: US 10,102,971 B2
(45) Date of Patent: Oct. 16, 2018

(54) MULTILAYER CAPACITOR WITH AN OVERCURRENT PROTECTION DEVICE

(71) Applicant: TDK CORPORATION, Tokyo (JP)

(72) Inventors: Norihisa Ando, Tokyo (JP); Masahiro Mori, Tokyo (JP); Sunao Masuda, Tokyo (JP); Kayou Kusano, Nikaho (JP)

(73) Assignee: TDK CORPORATION, Tokyo (JP)

( * ) Notice: Subject to any disclaimer, the term of this patent is extended or adjusted under 35 U.S.C. 154(b) by 247 days.

(21) Appl. No.: 15/286,122

(22) Filed: Oct. 5, 2016

(65) Prior Publication Data

US 2017/0103852 A1 Apr. 13, 2017

(30) Foreign Application Priority Data

Oct. 8, 2015 (JP) .................................. 2015-199994

(51) Int. Cl.
*H01G 4/30* (2006.01)
*H01C 7/00* (2006.01)
(Continued)

(52) U.S. Cl.
CPC ........... *H01G 4/002* (2013.01); *H01G 4/1227* (2013.01); *H01G 4/1236* (2013.01); *H01G 4/242* (2013.01); *H01G 4/30* (2013.01)

(58) Field of Classification Search
CPC ............ H01G 2/06; H01G 2/065; H01G 2/14; H01G 2/16; H01G 4/002; H01G 4/005;
(Continued)

(56) References Cited

U.S. PATENT DOCUMENTS 6,124,769 A * 9/2000 Igarashi ................. H01C 1/142
333/172
6,191,933 B1 * 2/2001 Ishigaki ................. H01G 4/232
361/309
(Continued)

FOREIGN PATENT DOCUMENTS

JP H04-302116 A 10/1992
JP 11283865 A * 10/1999 ............... H01G 4/06

*Primary Examiner* — Thienvu Tran
*Assistant Examiner* — Nicolas Bellido
(74) *Attorney, Agent, or Firm* — Oliff PLC

(57) ABSTRACT

A first substrate includes a substrate main body including a first principal surface and a second principal surface opposing each other in a first direction, first and second connection electrodes disposed on the first principal surface, and third and fourth connection electrodes disposed on the second principal surface. A first metal terminal includes a first connection portion electrically connected with the first connection electrode, and a first leg portion extending from the first connection portion. A second metal terminal includes a second connection portion electrically connected with the fourth connection electrode, and a second leg portion extending from the second connection portion. A multilayer capacitor is disposed on the first principal surface side of the first substrate, and an overcurrent protection device is disposed on the second principal surface side of the first substrate. The second connection electrode and the third connection electrode are electrically connected to each other.

17 Claims, 28 Drawing Sheets

(51) Int. Cl.
*H01C 7/02* (2006.01)
*H01G 4/12* (2006.01)
*H01G 4/002* (2006.01)
*H01G 4/242* (2006.01)

(58) Field of Classification Search
CPC ........ H01G 4/0085; H01G 4/01; H01G 4/012; H01G 4/12; H01G 4/1227; H01G 4/1236; H01G 4/224; H01G 4/228; H01G 4/232; H01G 4/2325; H01G 4/242; H01G 4/248; H01G 4/258; H01G 4/30; H01G 4/38; H01G 4/40; H01G 9/0003; H01G 9/28; H01H 2085/0414; H01H 85/0418; H01H 85/1755; H05K 1/0231; H05K 1/09; H05K 1/111; H05K 1/181; H05K 2201/10015; H05K 2201/10181; H05K 2201/10287; H05K 2201/10515; H05K 2201/10522; H05K 2201/1053; H05K 2201/10636; H05K 2201/10651; H05K 2201/10946; H05K 2203/048; H05K 2203/049; H05K 3/3421; H05K 3/3426; H05K 3/3431; H05K 3/3436; Y02P 70/611; Y02P 70/613
See application file for complete search history.

(56) References Cited

U.S. PATENT DOCUMENTS

| | | | | |
|---|---|---|---|---|
| 6,288,887 B1* | 9/2001 | Yoshida | ............... | H01G 4/232 361/306.1 |
| 9,881,742 B2* | 1/2018 | Ando | ............... | H01G 4/40 |
| 9,916,929 B2* | 3/2018 | Ando | ............... | H01G 2/16 |
| 2005/0041367 A1* | 2/2005 | Yoshii | ............... | H01G 2/065 361/303 |
| 2009/0084487 A1* | 4/2009 | Iijima | ............... | H01G 4/30 156/89.12 |
| 2009/0296311 A1* | 12/2009 | Otsuka | ............... | H01G 2/065 361/306.3 |
| 2012/0300361 A1* | 11/2012 | Togashi | ............... | H01G 4/30 361/301.4 |
| 2014/0055910 A1* | 2/2014 | Masuda | ............... | H01G 4/01 361/303 |
| 2015/0340154 A1* | 11/2015 | Kim | ............... | H01G 2/14 174/260 |
| 2017/0186539 A1* | 6/2017 | Masuda | ............... | H01G 4/232 |

\* cited by examiner

MULTILAYER CAPACITOR WITH AN OVERCURRENT PROTECTION DEVICE

TECHNICAL FIELD

The present invention relates to an electronic component.

BACKGROUND

Known electronic components include a multilayer capacitor, a substrate, and a pair of metal terminals (e.g., cf. Japanese Unexamined Patent Publication No. H04-302116). The multilayer capacitor includes a pair of external electrodes. The pair of external electrodes is connected to a pair of electrodes disposed on the substrate, and the multilayer capacitor is mounted on the substrate. The pair of metal terminals is connected to the pair of electrodes disposed on the substrate, and is electrically connected with the multilayer capacitor.

SUMMARY

In the electronic component described in Japanese Unexamined Patent Publication No. H04-302116, if the multilayer capacitor short-circuits, overcurrent may flow.

The object of an aspect of the present invention is to provide an electronic component that prevents overcurrent flow even if a multilayer capacitor short-circuits.

An electronic component according to one aspect of the present invention includes a multilayer capacitor, an overcurrent protection device, a first substrate, a first metal terminal, and a second metal terminal. The multilayer capacitor includes a first element body, first and second internal electrodes, and first and second external electrodes. The first and second internal electrodes are disposed in the first element body, and oppose each other. The first external electrode is disposed at one end portion of the first element body, and is connected with the first internal electrode. The second external electrode is disposed at the other one end portion of the first element body, and is connected with the second internal electrode. The overcurrent protection device includes a second element body, a protection circuit element disposed in the second element body, a third external electrode, and a fourth external electrode. The third external electrode is disposed at one end portion of the second element body, and is connected with the protection circuit element. The fourth external electrode is disposed at the other one end portion of the second element body, and is connected with the protection circuit element. The first substrate includes a substrate main body, a first connection electrode, a second connection electrode, a third connection electrode, and a fourth connection electrode. The substrate main body includes a first principal surface and a second principal surface opposing each other in a first direction. The first connection electrode is disposed on the first principal surface, and is connected with the first external electrode. The second connection electrode is disposed on the first principal surface, and is connected with the second external electrode. The third connection electrode is disposed on the second principal surface, and is connected with the third external electrode. The fourth connection electrode is disposed on the second principal surface, and is connected with the fourth external electrode. The first metal terminal includes a first connection portion and a first leg portion extending from the first connection portion. The first connection portion is fixed to one end portion side of the first substrate in a second direction orthogonal to the first direction, and is electrically connected with the first connection electrode. The second metal terminal includes a second connection portion and a second leg portion extending from the second connection portion. The second connection portion is fixed to the other one end portion side of the first substrate in the second direction, and is electrically connected with the fourth connection electrode. The multilayer capacitor is disposed on the first principal surface side of the first substrate, and the overcurrent protection device is disposed on the second principal surface side of the first substrate. The second connection electrode and the third connection electrode are electrically connected to each other.

In the electronic component according to the one aspect, the first connection portion of the first metal terminal and the first connection electrode of the first substrate are electrically connected to each other, and the first external electrode of the multilayer capacitor and the first connection electrode are connected to each other. The second external electrode of the multilayer capacitor and the second connection electrode of the first substrate are connected to each other, the third external electrode of the protection circuit element and the third connection electrode of the first substrate are connected to each other, and the second connection electrode and the third connection electrode are electrically connected to each other. The fourth external electrode of the protection circuit element and the fourth connection electrode of the first substrate are connected to each other, and the fourth connection electrode and the second connection portion of the second metal terminal are electrically connected to each other. Thus, the multilayer capacitor and the overcurrent protection device are connected in series between the first and second metal terminals. Because the multilayer capacitor and the overcurrent protection device are connected in series, even if the multilayer capacitor short-circuits, the overcurrent protection device prevents overcurrent from flowing between the first and second metal terminals.

The multilayer capacitor is disposed on the first principal surface side of the first substrate, and the overcurrent protection device is disposed on the second principal surface side of the first substrate. Thus, a configuration in which the multilayer capacitor and the overcurrent protection device overlap each other at least partially when viewed from the first direction can be employed. Therefore, the design flexibility related to the layout of the multilayer capacitor and the overcurrent protection device can be enhanced, and an increase in mounted area of the electronic component is suppressed.

When voltage is applied to the multilayer capacitor, mechanical strain arises in magnitude depending upon the applied voltage in the first element body due to an electrostrictive effect. The mechanical strain generates vibration of the multilayer capacitor (hereinafter, referred to as electrostrictive vibration). When the multilayer capacitor is directly mounted on an electronic device (e.g., circuit board, another electronic component, or the like), and voltage is applied to the multilayer capacitor, electrostrictive vibration propagates to the electronic device. If the electrostrictive vibration propagates to the electronic device, the electronic device may vibrate, and vibration sound may be generated.

In the electronic component according to the one aspect, since the first metal terminal includes the first leg portion, and the second metal terminal includes the second leg portion, the first and second leg portions absorb the electrostrictive vibration. Thus, in the electronic component according to the one aspect, the propagation of electrostrictive vibration to an electronic device is suppressed. The generation of vibration sound is accordingly suppressed in the electronic device.

In one embodiment of the electronic component, the multilayer capacitor may be disposed closer to the first and second leg portions than the first substrate, and the first external electrode may be connected with the first leg portion. In this embodiment, for example, the support strength of the multilayer capacitor is higher and the multilayer capacitor is more difficult to fall, as compared with an electronic component in which a first external electrode is not connected with a first leg portion.

In one embodiment of the electronic component, the overcurrent protection device may be disposed closer to the first and second leg portions than the first substrate, and the fourth external electrode may be connected with the second leg portion. In this embodiment, for example, the support strength of the overcurrent protection device is higher and the overcurrent protection device is more difficult to fall, as compared with an electronic component in which a fourth external electrode is not connected with a second leg portion.

In one embodiment of the electronic component, one of the multilayer capacitor and the overcurrent protection device may be smaller than the other one, and the one of the multilayer capacitor and the overcurrent protection device may be disposed closer to the first and second leg portions than the first substrate. In this embodiment, the other one of the multilayer capacitor and the overcurrent protection device has larger weight as compared with that of the one. Thus, if the other one of the multilayer capacitor and the overcurrent protection device is disposed closer to the first and second leg portions than the first substrate, the other one possibly falls due to its own weight. The one of the multilayer capacitor and the overcurrent protection device has smaller weight than that of the other one. Thus, even if the one of the multilayer capacitor and the overcurrent protection device is disposed closer to the first and second leg portions than the first substrate, the one is difficult to fall.

In one embodiment of the electronic component, the first leg portion and the second leg portion may each include a mounted region extending in a direction in which the first leg portion and the second leg portion oppose each other. One of the multilayer capacitor and the overcurrent protection device may do not have to overlap each mounted region when viewed in the first direction. In this embodiment, even if the above-described one of the multilayer capacitor and the overcurrent protection device falls, there is a low possibility that the one simultaneously contacts the first metal terminal and the second metal terminal. Thus, in this embodiment, short circuit of the first metal terminal and the second metal terminal can be suppressed.

In one embodiment of the electronic component, the first connection portion and the second connection portion may each include a connection region that opposes the first substrate in the first direction and extends in a direction in which the first connection portion and the second connection portion oppose each other. The connection region of the first connection portion may be fixed to the one end portion side of the first substrate, and the connection region of the second connection portion may be fixed to the other one end portion side of the first substrate. In this embodiment, the support strength of the first substrate is high, so that the fall of the first substrate can be prevented.

In one embodiment of the electronic component, the first connection portion and the second connection portion may each include at least a pair of connection regions that oppose each other and extend in a direction in which the first connection portion and the second connection portion oppose each other. One end portion of the first substrate may be fitted at least between the pair of connection regions of the first connection portion, and the other one end portion of the first substrate may be fitted at least between the pair of connection regions of the second connection portion. In this embodiment, the first and second metal terminals and the first substrate are surely fixed.

In one embodiment of the electronic component, the first element body and the second element body may have a rectangular parallelepiped shape, and one of the multilayer capacitor and the overcurrent protection device may be disposed closer to the first and second leg portions than the first substrate. A length in a longitudinal direction of the one of the multilayer capacitor and the overcurrent protection device may be equal to or smaller than a length in a width direction of the other one. The multilayer capacitor and the overcurrent protection device may be disposed in such a manner that the longitudinal direction of the first element body and the longitudinal direction of the second element body intersect with each other. In this embodiment, as compared with an electronic component in which a multilayer capacitor and an overcurrent protection device are disposed in such a manner that a longitudinal direction of a first element body and a longitudinal direction of a second element body are parallel, areas of connection regions of the first connection portion and the second connection portion can be set to be larger. As a result, the support strength of the first substrate that is exerted by the first metal terminal and the second metal terminal can be enhanced.

In one embodiment of the electronic component, the multilayer capacitor may be disposed closer to the first and second leg portions than the first substrate. The first element body may include a first side surface opposing the first principal surface of the substrate main body, a second side surface opposing the first side surface in the first direction, and first and second end surfaces opposing each other in the second direction. The first external electrode may include electrode portions disposed on the first side surface, the second side surface, and the first end surface. The second external electrode may include electrode portions disposed on the first side surface, the second side surface, and the second end surface. The electrode portion disposed on the second side surface of the first external electrode, and the respective electrode portions disposed on the second side surface and the second end surface of the second external electrode may be covered with an insulator. In this embodiment, the insulator is disposed between the second metal terminal and the second external electrode of the multilayer capacitor. Thus, short circuit is difficult to be caused by the contact between the second metal terminal and the second external electrode. Even if the multilayer capacitor falls, the insulator prevents the multilayer capacitor from contacting another region (first and second metal terminals, or another electronic device (a circuit board, an electronic component, or the like)). As a result, even when the multilayer capacitor falls, short circuit is difficult to occur.

In one embodiment of the electronic component, the overcurrent protection device may be disposed closer to the first and second leg portions than the first substrate. The second element body may include a third side surface opposing the second principal surface of the substrate main body, a fourth side surface opposing the third side surface in the first direction, and third and fourth end surfaces opposing each other in the second direction. The third external electrode may include electrode portions disposed on the third side surface, the fourth side surface, and the third end surface. The fourth external electrode may include electrode portions disposed on the third side surface, the fourth side surface, and the fourth end surface. The respective electrode portions disposed on the fourth side surface and the first end surface of the third external electrode, and the electrode portion disposed on the fourth side surface of the fourth external electrode may be covered with an insulator. In this embodiment, the insulator is disposed between the first metal terminal and the third external electrode of the overcurrent protection device. Thus, short circuit is difficult to be caused by the contact between the first metal terminal and the third external electrode. Even if the overcurrent protection device falls, the insulator prevents the overcurrent protection device from contacting another region. As a result, even when the overcurrent protection device falls, short circuit is difficult to occur.

The electronic component according to the one aspect may include a second substrate fixed to one of the multilayer capacitor and the overcurrent protection device. The one of the multilayer capacitor and the overcurrent protection device may be disposed closer to the first and second leg portions than the first substrate, and may be disposed between the first substrate and the second substrate in the first direction. The second substrate may be separated from the first and second metal terminals. In this embodiment, even if the one of the multilayer capacitor and the overcurrent protection device falls, the second substrate prevents the above-described one of the multilayer capacitor and the overcurrent protection device from contacting another region. Thus, short circuit is difficult to occur. Because the second substrate is separated from the first and second metal terminals, absorption of electrostrictive vibration in the first and second leg portions is not disturbed. Thus, in this embodiment, the propagation of electrostrictive vibration to an electronic device can be surely suppressed In one embodiment of the electronic component, the second connection electrode and the third connection electrode may be electrically connected to each other via a through-hole conductor penetrating through the substrate main body. In this embodiment, for example, as compared with an electronic component in which a conductor that electrically connects a second connection electrode and a third connection electrode is disposed on the surface of a substrate main body, a current path between the second connection electrode and the third connection electrode is short. Thus, in this embodiment, lowering of resistance is achieved.

In one embodiment of the electronic component, the overcurrent protection device may be a PTC thermistor, and may include at least a pair of internal electrodes opposing each other, as the protection circuit element. One of the internal electrodes may be connected to the third external electrode, and the other one of the internal electrodes may be connected to the fourth external electrode. In this embodiment, if the short circuit of the multilayer capacitor causes overcurrent to flow between the first and second metal terminals, the resistance between the pair of internal electrodes of the PTC thermistor becomes higher. Thus, current is difficult to flow between the first and second metal terminals.

In one embodiment of the electronic component, the overcurrent protection device may be a fuse, and may include an inner conductor made of soluble metal, as the protection circuit element. One end portion of the inner conductor may be connected to the third external electrode, and the other one end portion of the inner conductor may be connected to the fourth external electrode. In this embodiment, if the short circuit of the multilayer capacitor causes overcurrent to flow between the first and second metal terminals, the inner conductor melts down. Thus, current does not flow between the first and second metal terminals.

In one embodiment of the electronic component, the multilayer capacitor may be larger than the overcurrent protection device. In this embodiment, for example, an area where the first and second internal electrodes oppose each other can be set to be larger. Thus, the capacity of the multilayer capacitor can be easily increased to large capacity.

In one embodiment of the electronic component, the multilayer capacitor and the overcurrent protection device may overlap each other at least partially when viewed in the first direction. In this embodiment, as compared with an electronic component in which a multilayer capacitor and an overcurrent protection device do not overlap each other when viewed in the first direction, the size of the first substrate when viewed in the first direction can be set to be smaller. As a result, the mounting area of the electronic component can be reduced.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION

Figure 1:
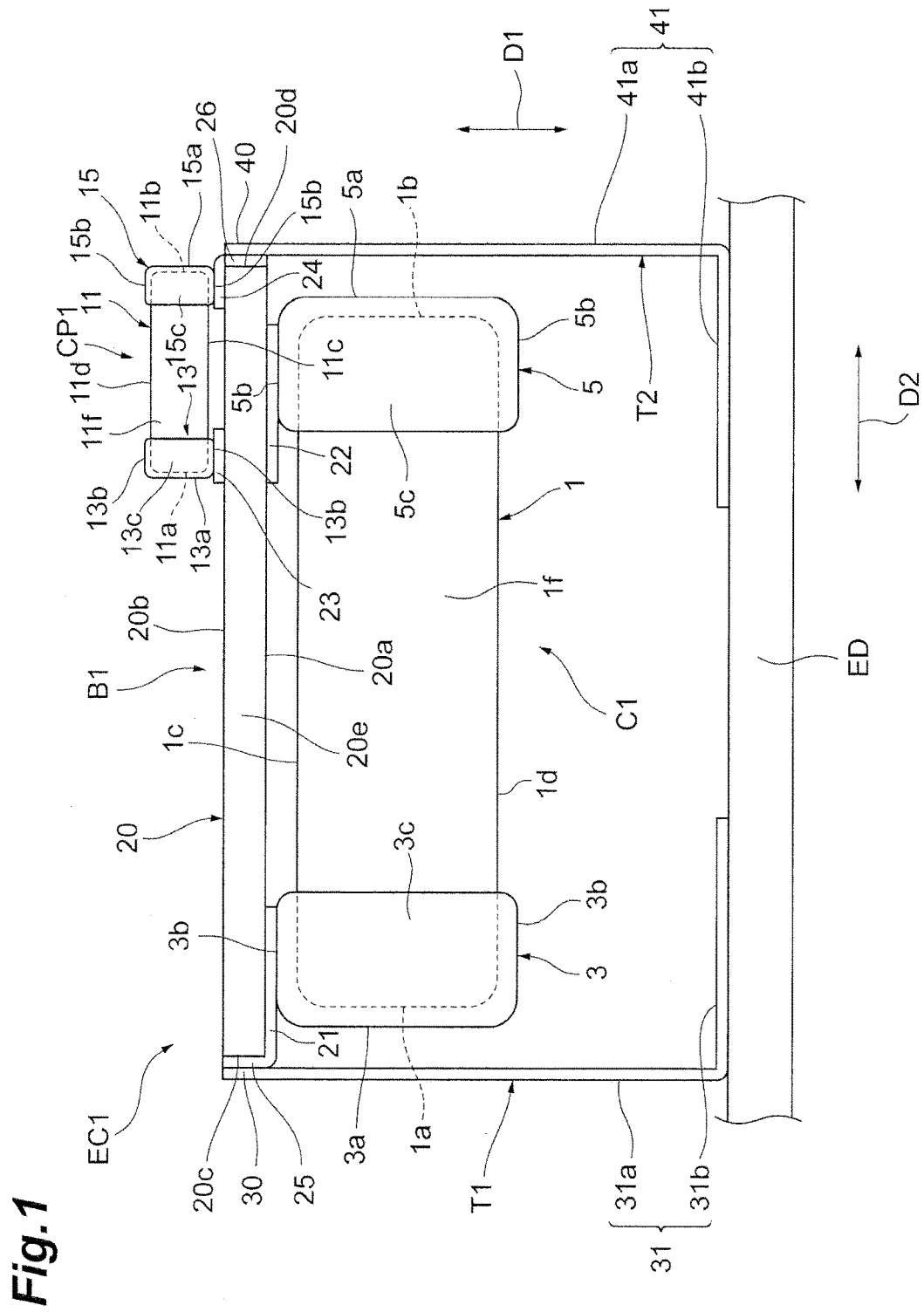
FIG. 1 is a side view illustrating an electronic component according to an embodiment.

Hereinafter, an embodiment of the present invention will be described in detail with reference to the attached drawings. In the following description, the same elements or elements having the same function are assigned the same reference numeral, and the redundant description will be omitted.

Figure 2:
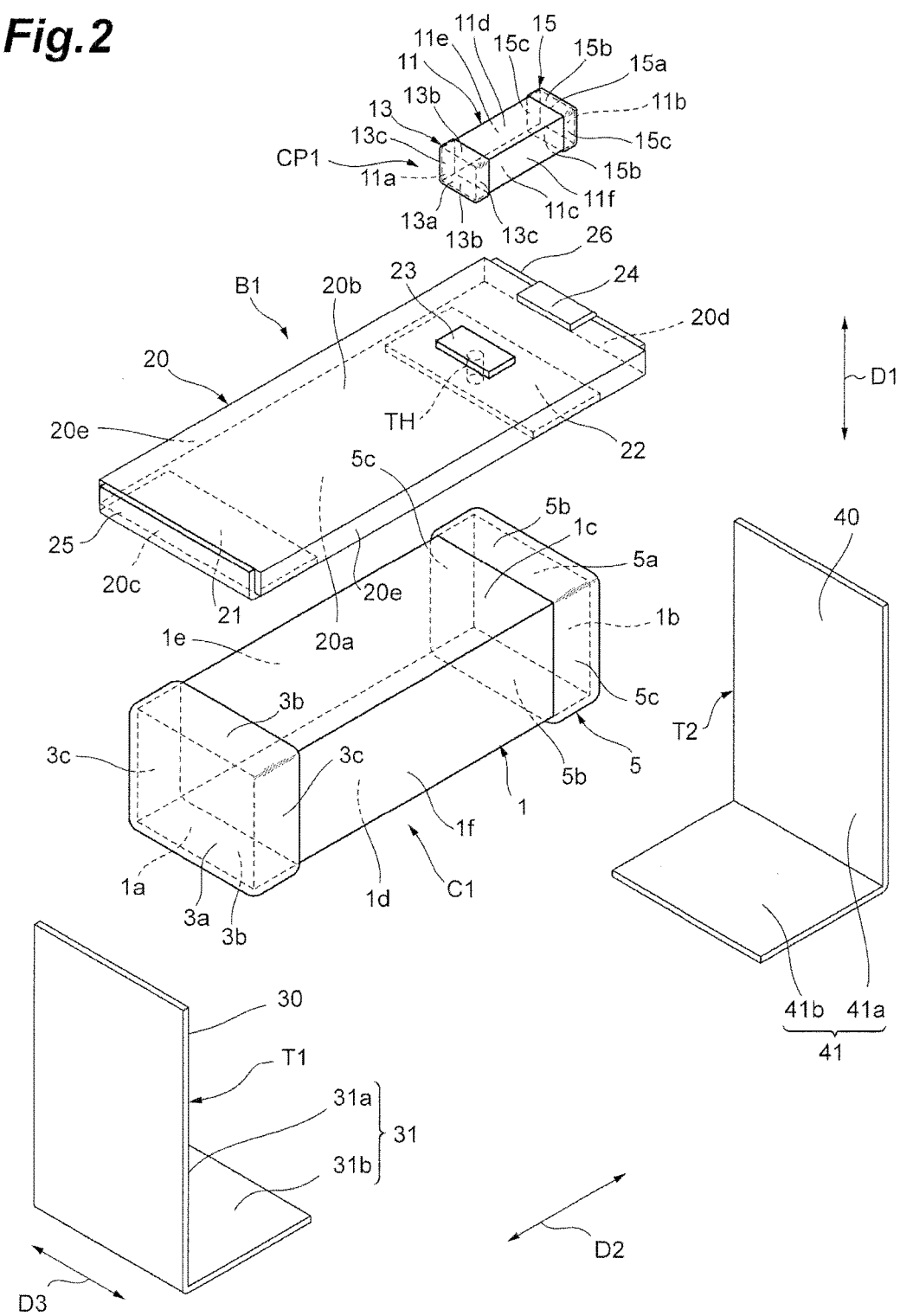
FIG. 2 is an exploded perspective view illustrating the electronic component according to the present embodiment.
Figure 3:
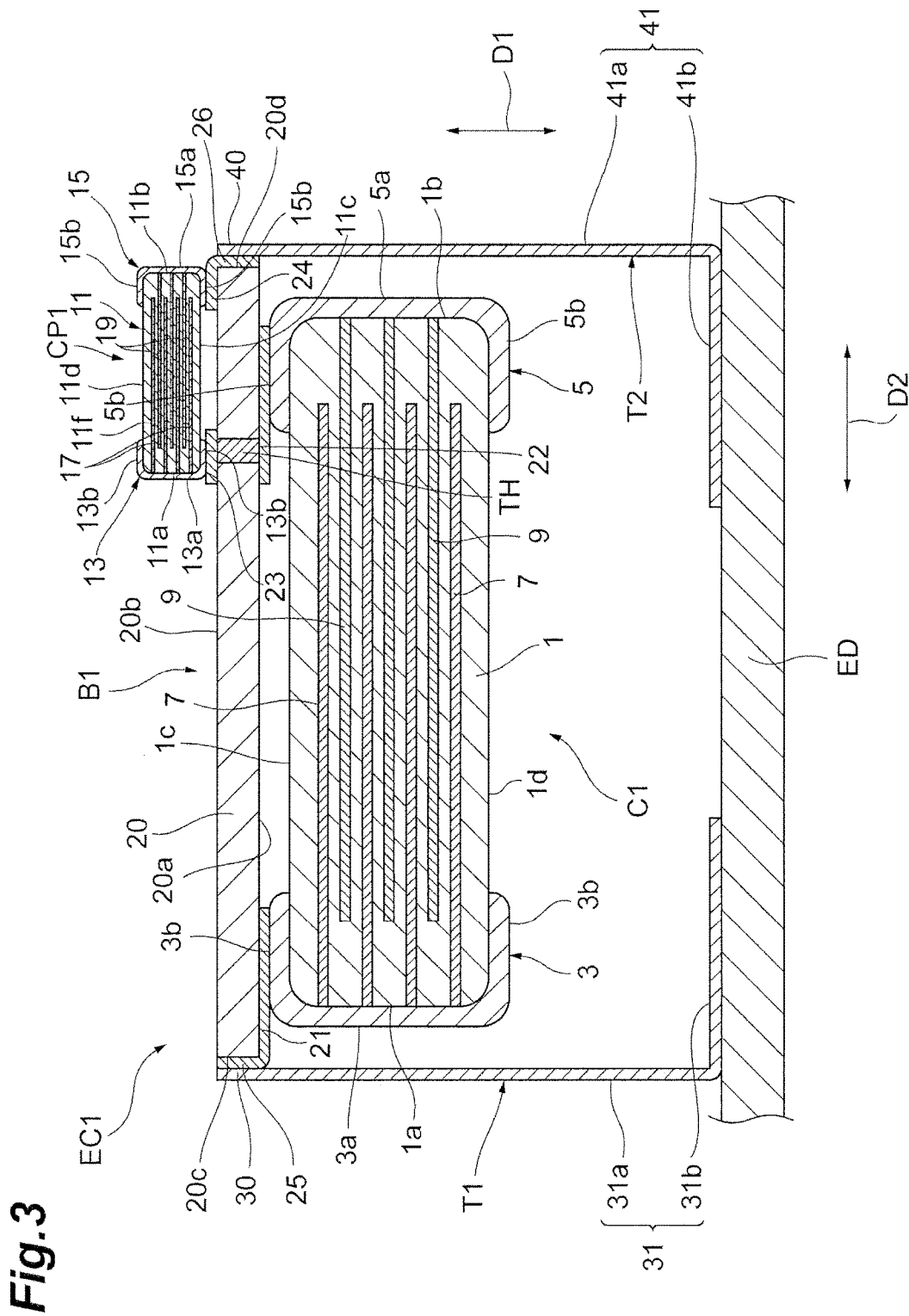
FIG. 3 is a diagram for illustrating a cross-sectional configuration of the electronic component according to the present embodiment.

The configuration of an electronic component EC1 according to the present embodiment will be described hereinafter with reference to FIGS. 1 to 3. FIG. 1 is a side view illustrating the electronic component according to the present embodiment. FIG. 2 is an exploded perspective view illustrating the electronic component according to the present embodiment. FIG. 3 is a diagram for illustrating a cross-sectional configuration of the electronic component according to the present embodiment.

As illustrated in FIGS. 1 to 3, the electronic component EC1 includes a multilayer capacitor C1, an overcurrent protection device CP1, a first substrate B1, a first metal terminal T1, and a second metal terminal T2.

The multilayer capacitor C1 includes a first element body 1 having a rectangular parallelepiped shape, and a first external electrode 3 and a second external electrode 5 that are disposed on the outer surfaces of the first element body 1. The first external electrode 3 and the second external electrode 5 are separated from each other. The rectangular parallelepiped shape includes a shape of a rectangular parallelepiped with chamfered corner portions and ridge line portions, and a shape of a rectangular parallelepiped with rounded corner portions and ridge line portions.

The first element body 1 includes first and second end surfaces $1a$ and $1b$ opposing each other, a pair of side surfaces $1c$ and $1d$ opposing each other and each having an oblong shape, and a pair of side surfaces $1e$ and $1f$ opposing each other and each having an oblong shape. The first and second end surfaces $1a$ and $1b$, and the four side surfaces $1c$, $1d$, $1e$, and $1f$ constitute the outer surfaces of the first element body 1. The direction in which the side surfaces $1c$ and $1d$ oppose each other corresponds to a first direction D1. The direction in which the first and second end surfaces $1a$ and $1b$ oppose each other corresponds to a second direction D2. The direction in which the side surfaces $1e$ and $1f$ oppose each other corresponds to a third direction D3. The second direction D2 is orthogonal to the first direction D1. The third direction D3 is orthogonal to the first direction D1 and the second direction D2. The direction in which the first and second end surfaces $1a$ and $1b$ oppose each other corresponds to the longitudinal direction of the first element body 1.

The pair of side surfaces $1c$ and $1d$ extends in the second direction D2 to connect between the first and second end surfaces $1a$ and $1b$. The pair of side surfaces $1c$ and $1d$ extends also in the third direction D3. The pair of side surfaces $1e$ and $1f$ extends in the second direction D2 to connect between the first and second end surfaces $1a$ and $1b$. The pair of side surfaces $1e$ and $1f$ extends also in the first direction D1.

The first element body 1 includes a plurality of dielectric layers stacked in a direction in which the side surfaces $1c$ and $1d$ oppose each other (the first direction D1). In the first element body 1, the stacking direction of the plurality of dielectric layers corresponds to the first direction D1. Each dielectric layer includes a sintered body of a ceramic green sheet containing, for example, dielectric material ($BaTiO_3$-based, $Ba(Ti, Zr)O_3$-based, or $(Ba, Ca)TiO_3$-based dielectric ceramics, or the like). In the actual first element body 1, dielectric layers are so integrated that no boundary can be visually recognized between the dielectric layers. In the first element body 1, the stacking direction of the plurality of dielectric layers may correspond to the third direction D3.

As illustrated in FIG. 3, the multilayer capacitor C1 includes a plurality of first internal electrodes 7 and a plurality of second internal electrodes 9. The first and second internal electrodes 7 and 9 are made of electrically-conductive material (e.g., Ni, Cu, or the like) generally used for internal electrodes of a multilayered electric element. The first and second internal electrodes 7 and 9 include a sintered body of electrically-conductive paste. The electrically-conductive paste contains the above-described electrically-conductive material.

The first internal electrodes 7 and the second internal electrodes 9 are disposed in positions (layers) different in the first direction D1. The first internal electrodes 7 and the second internal electrodes 9 are alternately arranged in the first element body 1, and oppose each other with intervals in the first direction D1. The first internal electrodes 7 and the second internal electrodes 9 have polarities different from each other. The first internal electrodes 7 and the second internal electrodes 9 may be disposed in positions (layers) different in the third direction D3.

Figure 4A:
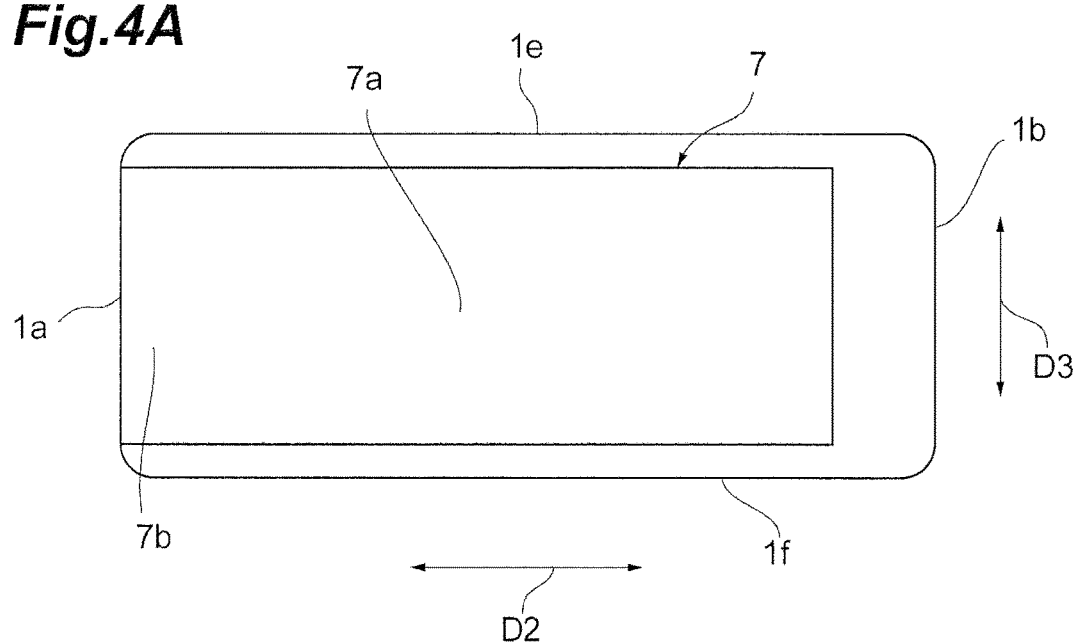
FIG. 4A is a plan view illustrating a first internal electrode.

As illustrated in FIG. 4A, each of the first internal electrodes 7 includes a main electrode portion $7a$ and a connection portion $7b$. The main electrode portion $7a$ has a rectangular shape with a long side direction corresponding to the second direction D2 and a short side direction corresponding to the third direction D3. The connection portion 7b extends from one side (one short side) of the main electrode portion 7a, and is exposed to the first end surface 1a. The connection portion 7b extends from an end portion on the first end surface 1a side of the main electrode portion 7a to the first end surface 1a.

The first internal electrode 7 extends in a direction orthogonal to the first end surface 1a to which the connection portion 7b is exposed (the second direction D2). The first internal electrode 7 is exposed to the first end surface 1a, and is not exposed to the second end surface 1b and the side surfaces 1c, 1d, 1e, and 1f. The connection portion 7b is connected to the first external electrode 3 at the end exposed to the first end surface 1a. The main electrode portion 7a and the connection portion 7b are integrally formed.

Figure 4B:
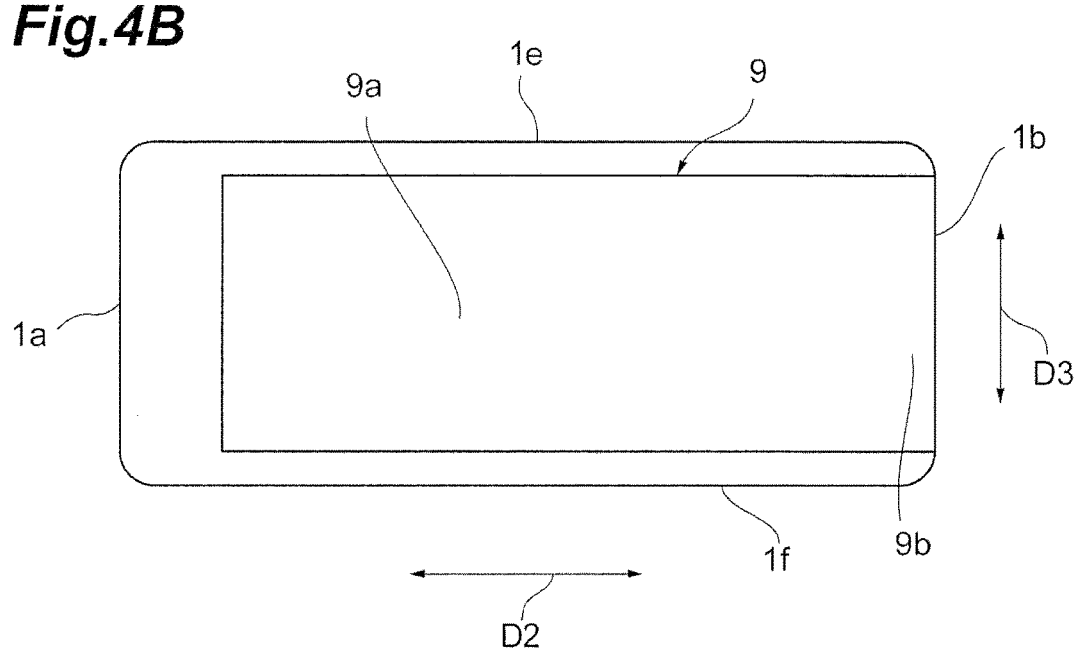
FIG. 4B is a plan view illustrating a second internal electrode.

As illustrated in FIG. 4B, each of the second internal electrodes 9 includes a main electrode portion 9a and a connection portion 9b. The main electrode portion 9a has a rectangular shape with a long side direction corresponding to the second direction D2 and a short side direction corresponding to the third direction D3. The connection portion 9b extends from one side (one short side) of the main electrode portion 9a, and is exposed to the second end surface 1b. The connection portion 9b extends from an end portion on the second end surface 1b side of the main electrode portion 9a to the second end surface 1b.

The second internal electrode 9 extends in a direction orthogonal to the second end surface 1b to which the connection portion 9b is exposed (the second direction D2). The second internal electrode 9 is exposed to the second end surface 1b, and is not exposed to the first end surface 1a and the side surfaces 1c, 1d, 1e, and 1f. The connection portion 9b is connected to the second external electrode 5 at the end exposed to the second end surface 1b. The main electrode portion 9a and the connection portion 9b are integrally formed.

The first external electrode 3 is disposed at an end portion on the first end surface 1a side of the first element body 1. The first external electrode 3 includes an electrode portion 3a disposed on the first end surface 1a, electrode portions 3b disposed on the pair of side surfaces 1c and 1d, and electrode portions 3c disposed on the pair of side surfaces 1e and 1f. The first external electrode 3 is formed by the 5 surfaces 1a, 1c, 1d, 1e, and 1f. The electrode portions 3a, 3b, and 3c adjacent to one another are connected to one another at ridge line portions of the first element body 1, and are electrically connected to one another.

The electrode portion 3a thoroughly covers a portion of each of the connection portions 7b that is exposed to the first end surface 1a. The connection portion 7b is directly connected to the first external electrode 3 (the electrode portion 3a). The connection portion 7b connects the main electrode portion 7a and the electrode portion 3a to each other. Each of the first internal electrodes 7 is electrically connected to the first external electrode 3.

The second external electrode 5 is disposed at an end portion on the second end surface 1b side of the first element body 1. The second external electrode 5 includes an electrode portion 5a disposed on the second end surface 1b, electrode portions 5b disposed on the pair of side surfaces 1c and 1d, and electrode portions 5c disposed on the pair of side surfaces 1e and 1f. The second external electrode 5 is formed by the 5 surfaces 1b, 1c, 1d, 1e, and 1f. The electrode portions 5a, 5b, and 5c adjacent to one another are connected to one another at ridge line portions of the first element body 1, and are electrically connected to one another.

The electrode portion 5a thoroughly covers a portion of each of the connection portions 9b that is exposed to the second end surface 1b. The connection portion 9b is directly connected to the second external electrode 5 (the electrode portion 5a). The connection portion 9b connects the main electrode portion 9a and the electrode portion 5a to each other. Each of the second internal electrodes 9 is electrically connected to the second external electrode 5.

The first and second external electrodes 3 and 5 include sintered conductor layers. The sintered conductor layer is formed by applying electrically-conductive paste to the outer surface of the first element body 1, and sintering the applied electrically-conductive paste. The electrically-conductive paste contains, for example, electrically-conductive metal powder and glass frit. The first and second external electrodes 3 and 5 may include plated layers disposed on the sintered conductor layers.

The overcurrent protection device CP1 includes a second element body 11 having a rectangular parallelepiped shape, and a third external electrode 13 and a fourth external electrode 15 that are disposed on the outer surfaces of the second element body 11. The third external electrode 13 and the fourth external electrode 15 are separated from each other. In the present embodiment, the overcurrent protection device CP1 is a PTC thermistor.

The second element body 11 includes third and fourth end surfaces 11a and 11b opposing each other, a pair of side surfaces 11c and 11d opposing each other and each having an oblong shape, and a pair of side surfaces 11e and 11f opposing each other and each having an oblong shape. The third and fourth end surfaces 11a and 11b, and the four side surfaces 11c, 11d, 11e, and 11f constitute the outer surfaces of the second element body 11. The direction in which the side surfaces 11c and 11d oppose each other corresponds to the first direction D1. The direction in which the third and fourth end surfaces 11a and 11b oppose each other corresponds to the second direction D2. The direction in which the side surfaces 11e and 11f oppose each other corresponds to a third direction D3. The direction in which the third and fourth end surfaces 11a and 11b oppose each other corresponds to the longitudinal direction of the second element body 11.

The pair of side surfaces 11c and 11d extends in the second direction D2 to connect between the third and fourth end surfaces 11a and 11b. The pair of side surfaces 11c and 11d extends also in the third direction D3. The pair of side surfaces 11e and 11f extends in the second direction D2 to connect between the third and fourth end surfaces 11a and 11b. The pair of side surfaces 11e and 11f extends also in the first direction D1.

The length in the second direction D2 of the second element body 11 is smaller than the length in the second direction D2 of the first element body 1. For example, the length in the second direction D2 of the second element body 11 is about half of the length in the second direction D2 of the first element body 1. In the present embodiment, the length in the first direction D1 of the second element body 11 is smaller than the length in the first direction D1 of the first element body 1, and the length in the third direction D3 of the second element body 11 is also smaller than the length in the third direction D3 of the first element body 1. In the present embodiment, the overcurrent protection device CP1 is smaller than the multilayer capacitor C1.

In the present embodiment, the second direction D2 corresponds to the longitudinal direction of the multilayer capacitor C1 (first element body 1) and the overcurrent protection device CP1 (second element body 11). The third direction D3 corresponds to the width direction of the multilayer capacitor C1 (first element body 1) and the overcurrent protection device CP1 (second element body 11). The first direction D1 corresponds to the height direction of the multilayer capacitor C1 (first element body 1) and the overcurrent protection device CP1 (second element body 11).

The second element body 11 includes a plurality of semiconductor layers stacked in a direction in which the side surfaces 11c and 11d oppose each other. In the second element body 11, the stacking direction of the plurality of semiconductor layers corresponds to the first direction D1. Each semiconductor layer includes a sintered body of a ceramic green sheet containing semiconductor material (e.g., $BaTiO_3$-based semiconductor ceramics or the like). In the actual second element body 11, the semiconductor layers are so integrated that no boundary can be visually recognized between the semiconductor layers. In the second element body 11, the stacking direction of the plurality of semiconductor layers may correspond to the third direction D3.

The overcurrent protection device CP1 includes a protection circuit element disposed in the second element body 11. In the present embodiment, as illustrated in FIG. 3, the overcurrent protection device CP1 includes a plurality of third internal electrodes 17 and a plurality of fourth internal electrodes 19. The plurality of third internal electrodes 17 and the plurality of fourth internal electrodes 19 constitute the protection circuit element. The third and fourth internal electrodes 17 and 19 are made of electrically-conductive material (e.g., Ni, Cu, or the like) generally used for internal electrodes of a multilayered electric element. The third and fourth internal electrodes 17 and 19 include a sintered body of electrically-conductive paste. The electrically-conductive paste contains the above-described electrically-conductive material.

The third and fourth internal electrodes 17 and 19 are disposed in positions (layers) different in the first direction D1. The third and fourth internal electrodes 17 and 19 are alternately arranged in the second element body 11, and oppose each other with intervals in the first direction D1. In other words, the overcurrent protection device CP1 includes at least a pair of internal electrodes 17 and 19 opposing each other. The third and fourth internal electrodes 17 and 19 may be disposed in positions (layers) different in the third direction D3.

Figure 5A:
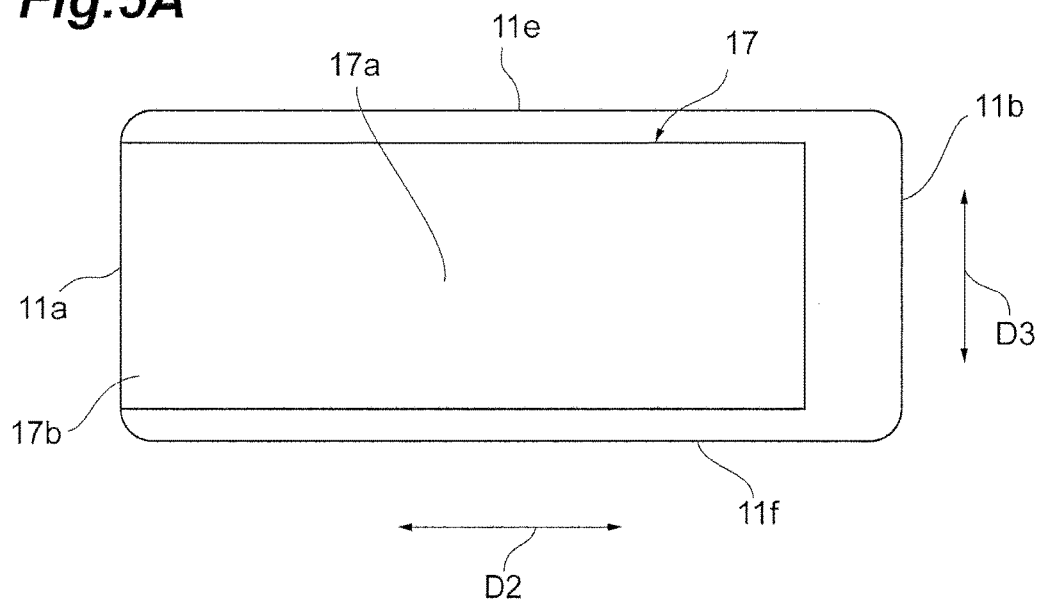
FIG. 5A is a plan view illustrating a third internal electrode.

As illustrated in FIG. 5A, each of the third internal electrodes 17 includes a main electrode portion 17a and a connection portion 17b. The main electrode portion 17a has a rectangular shape with a long side direction corresponding to the second direction D2 and a short side direction corresponding to the third direction D3. The connection portion 17b extends from one side (one short side) of the main electrode portion 17a, and is exposed to the third end surface 11a. The connection portion 17b extends from an end portion on the third end surface 11a side of the main electrode portion 17a to the third end surface 11a.

The third internal electrode 17 extends in a direction orthogonal to the third end surface 11a to which the connection portion 17b is exposed (the second direction D2). The third internal electrode 17 is exposed to the third end surface 11a, and is not exposed to the fourth end surface 11b, and the side surfaces 11c, 11d, 11e, and 11f. The connection portion 17b is connected to the third external electrode 13 at the end exposed to the third end surface 11a. The main electrode portion 17a and the connection portion 17b are integrally formed.

Figure 5B:
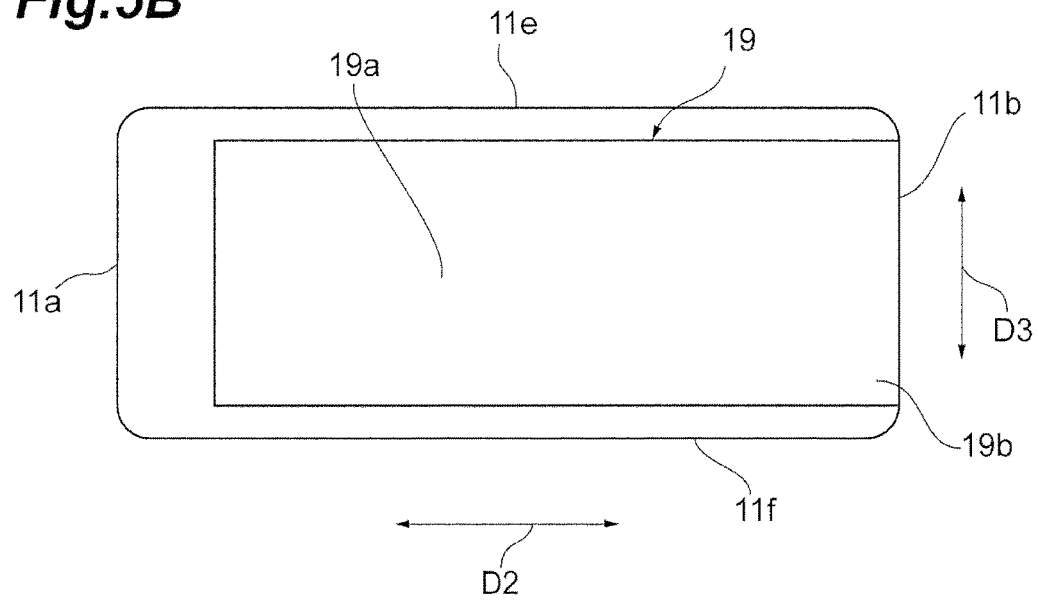
FIG. 5B is a plan view illustrating a fourth internal electrode.

As illustrated in FIG. 5B, each of the fourth internal electrodes 19 includes a main electrode portion 19a and a connection portion 19b. The main electrode portion 19a has a rectangular shape with a long side direction corresponding to the second direction D2 and a short side direction corresponding to the third direction D3. The connection portion 19b extends from one side (one short side) of the main electrode portion 19a, and is exposed to the fourth end surface 11b. The connection portion 19b extends from an end portion on the fourth end surface 11b side of the main electrode portion 19a to the fourth end surface 11b.

The fourth internal electrode 19 extends in a direction orthogonal to the fourth end surface 11b to which the connection portion 19b is exposed (the second direction D2). The fourth internal electrode 19 is exposed to the fourth end surface 11b, and is not exposed to the third end surface 11a, and the side surfaces 11c, 11d, 11e, and 11f. The connection portion 19b is connected to the fourth external electrode 15 at the end exposed to the fourth end surface 11b. The main electrode portion 19a and the connection portion 19b are integrally formed.

The third external electrode 13 is disposed at an end portion on the third end surface 11a side of the second element body 11. The third external electrode 13 includes an electrode portion 13a disposed on the third end surface 11a, electrode portions 13b disposed on the pair of side surfaces 11c and 11d, and electrode portions 13c disposed on the pair of side surfaces 11e and 11f. The third external electrode 13 is formed by the 5 surfaces 11a, 11c, 11d, 11e, and 11f. The electrode portions 13a, 13b, and 13c adjacent to one another are connected to one another at ridge line portions of the second element body 11, and are electrically connected to one another.

The electrode portion 13a thoroughly covers a portion of each of the connection portions 17b that is exposed to the third end surface 11a. The connection portion 17b is directly connected to the third external electrode 13 (the electrode portion 13a). The connection portion 17b connects the main electrode portion 17a and the electrode portion 13a to each other. Each of the third internal electrodes 17 is electrically connected to the third external electrode 13.

The fourth external electrode 15 is disposed at an end portion on the fourth end surface 11b side of the second element body 11. The fourth external electrode 15 includes an electrode portion 15a disposed on the fourth end surface 11b, electrode portions 15b disposed on the pair of side surfaces 11c and 11d, and electrode portions 15c disposed on the pair of side surfaces 11e and 11f. The fourth external electrode 15 is formed by the 5 surfaces 11b, 11c, 11d, 11e, and 11f. The electrode portions 15a, 15b, and 15c adjacent to one another are connected to one another at ridge line portions of the second element body 11, and are electrically connected to one another.

The electrode portion 15a thoroughly covers a portion of each of the connection portions 19b that is exposed to the fourth end surface 11b. The connection portion 19b is directly connected to the fourth external electrode 15 (the electrode portion 15a). The connection portion 19b connects the main electrode portion 19a and the electrode portion 15a to each other. Each of the fourth internal electrodes 19 is electrically connected to the fourth external electrode 15.

The third and fourth external electrodes 13 and 15 also include sintered conductor layers similarly to the first and second external electrodes 3 and 5. The sintered conductor layer is formed by applying electrically-conductive paste to the outer surface of the second element body 11, and sintering the applied electrically-conductive paste. The electrically-conductive paste contains, for example, electrically-conductive metal powder and glass frit. The third and fourth external electrodes 13 and 15 may include plated layers disposed on the sintered conductor layers.

The first substrate B1 includes a substrate main body 20, a first connection electrode 21, a second connection electrode 22, a third connection electrode 23, a fourth connection electrode 24, a fifth connection electrode 25, and a sixth connection electrode 26. The first connection electrode 21, the second connection electrode 22, the third connection electrode 23, the fourth connection electrode 24, the fifth connection electrode 25, and the sixth connection electrode 26 are disposed on the outer surface of the substrate main body 20.

The substrate main body 20 has an approximately-rectangular shape in a planar view. The substrate main body 20 includes a planar first principal surface 20a and a planar second principal surface 20b opposing each other, a pair of planar side surfaces 20c and 20d opposing each other, and a pair of planar side surfaces 20e opposing each other. The first principal surface 20a and the second principal surface 20b, and the 4 side surfaces 20c, 20d, and 20e constitute the outer surfaces of the substrate main body 20. The substrate main body 20 has an electrical insulation property. The substrate main body 20 is made of, for example, electrical insulating resin such as glass epoxy resin. The direction in which the first and second principal surfaces 20a and 20b oppose each other corresponds to the first direction D1. The direction in which the side surfaces 20c and 20d oppose each other corresponds to the second direction D2. The direction in which the pair of side surfaces 20e oppose each other corresponds to the third direction D3.

The length in the second direction D2 of the substrate main body 20 is larger than the length in the second direction D2 of the multilayer capacitor C1. The length in the third direction D3 of the substrate main body 20 is larger than the length in the third direction D3 of the multilayer capacitor C1.

The pair of side surfaces 20c and 20d extends in the first direction D1 to connect between the first and second principal surfaces 20a and 20b. The pair of side surfaces 20c and 20d extends also in the third direction D3. The pair of side surfaces 20e extends in the first direction D1 to connect between the first and second principal surfaces 20a and 20b. The pair of side surfaces 20e extends also in the second direction D2. The first principal surface 20a and the second principal surface 20b have an oblong shape with a long side direction corresponding to the second direction D2 and a short side direction corresponding to the third direction D3.

Figure 6A:
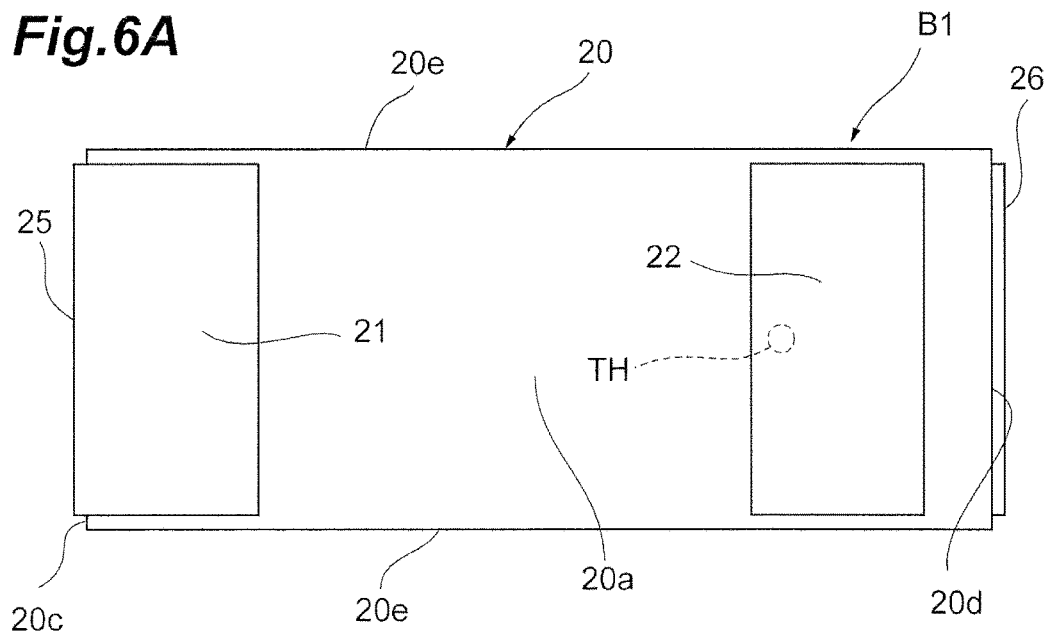
FIG. 6A is a plan view illustrating first and second connection electrodes.

As illustrated in FIG. 6A, the first connection electrode 21 and the second connection electrode 22 are disposed on the first principal surface 20a. On the first principal surface 20a, the first connection electrode 21 and the second connection electrode 22 are separated from each other in the second direction D2. The first connection electrode 21 is disposed closer to the side surface 20c than the center in the second direction D2 of the first principal surface 20a. One end in the second direction D2 of the first connection electrode 21 is positioned at an end on the side surface 20c side of the first principal surface 20a. The second connection electrode 22 is disposed closer to the side surface 20d than the center in the second direction D2 of the first principal surface 20a. The second connection electrode 22 is separated from an end on the side surface 20d side of the first principal surface 20a.

The first external electrode 3 of the multilayer capacitor C1 is connected to the first connection electrode 21. The first connection electrode 21 and the first external electrode 3 are connected to each other by, for example, a solder (not illustrated). The second external electrode 5 of the multilayer capacitor C1 is connected to the second connection electrode 22. The second connection electrode 22 and the second external electrode 5 are connected to each other by, for example, a solder (not illustrated). The multilayer capacitor C1 is disposed on the first principal surface 20a side of the first substrate B1, and is mounted on the first substrate B1. In the present embodiment, the multilayer capacitor C1 is mounted on the first substrate B1 in such a manner that the side surface 1c and the first principal surface 20a oppose each other in the first direction D1.

Figure 6B:
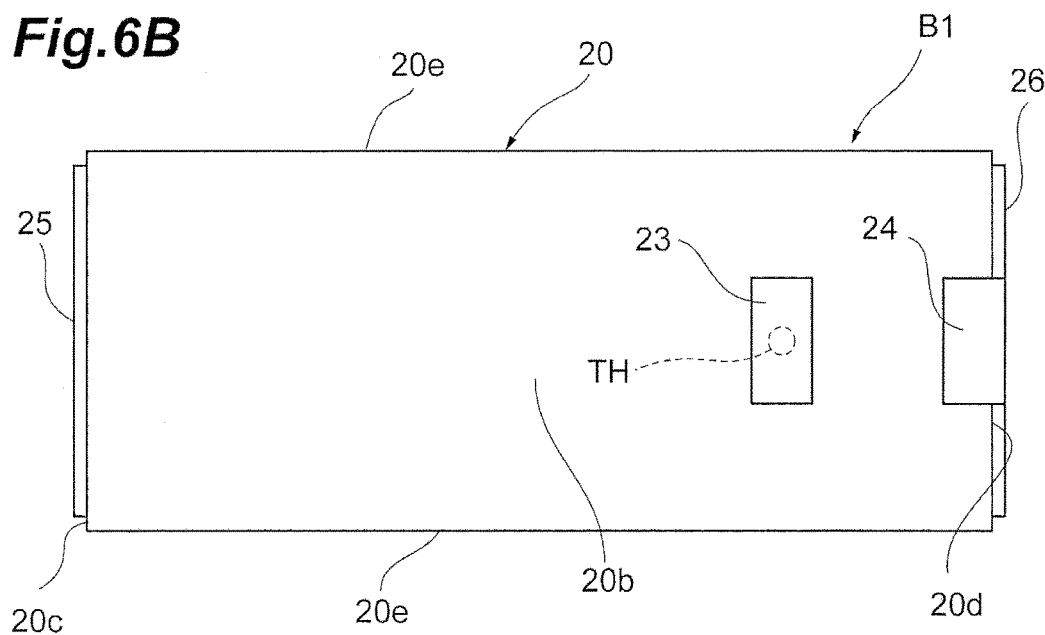
FIG. 6B is a plan view illustrating third and fourth connection electrodes.

As illustrated in FIG. 6B, the third connection electrode 23 and the fourth connection electrode 24 are disposed on the second principal surface 20b. On the second principal surface 20b, the third connection electrode 23 and the fourth connection electrode 24 are separated from each other in the second direction D2. The third connection electrode 23 and the fourth connection electrode 24 are disposed closer to the side surface 20d than the center in the second direction D2 of the second principal surface 20b. The third connection electrode 23 is separated from an end on the side surface 20d side of the second principal surface 20b. One end in the second direction D2 of the fourth connection electrode 24 is positioned at an end on the side surface 20d side of the second principal surface 20b.

The third external electrode 13 of the overcurrent protection device CP1 is connected to the third connection electrode 23. The third connection electrode 23 and third external electrode 13 are connected to each other by, for example, a solder (not illustrated). The fourth external electrode 15 of the overcurrent protection device CP1 is connected to the fourth connection electrode 24. The fourth connection electrode 24 and fourth external electrode 15 are connected to each other by, for example, a solder (not illustrated). The overcurrent protection device CP1 is disposed on the second principal surface 20b side of the first substrate B1, and is mounted on the first substrate B1. In the present embodiment, the overcurrent protection device CP1 is mounted on the first substrate B1 in such a manner that the side surface 11c and the second principal surface 20b oppose each other in the first direction D1.

The second connection electrode 22 and the third connection electrode 23 overlap each other at least partially when viewed from the first direction D1. The second connection electrode 22 and the third connection electrode 23 are electrically connected to each other via a through-hole conductor TH. The through-hole conductor TH is disposed on the substrate main body 20, and penetrates through the substrate main body 20. The second external electrode 5 of the multilayer capacitor C1 and the third external electrode 13 of the overcurrent protection device CP1 are electrically connected to each other via the second connection electrode 22, the through-hole conductor TH, and the third connection electrode 23.

The second connection electrode 22 and the third connection electrode 23 may be electrically connected to each other via a conductor disposed on the outer surface of the substrate main body 20. In this case, the conductor that electrically connects the second connection electrode 22 and the third connection electrode 23 to each other is disposed on, for example, the first principal surface 20a, the side surfaces 20e, and the second principal surface 20b.

The first substrate B1 is disposed between the multilayer capacitor C1 and the overcurrent protection device CP1 when viewed in the first direction D1. The multilayer capacitor C1 and the overcurrent protection device CP1 overlap each other at least partially when viewed from the first direction D1.

The fifth connection electrode 25 is disposed on the side surface 20c, and is connected with the first connection electrode 21. The first connection electrode 21 and the fifth connection electrode 25 are connected to each other at a ridge line portion of the first principal surface 20a and the side surface 20c, and are electrically connected to each other. In the present embodiment, the first connection electrode 21 and the fifth connection electrode 25 are integrally formed.

The sixth connection electrode 26 is disposed on the side surface 20d, and is connected with the fourth connection electrode 24. The fourth connection electrode 24 and the sixth connection electrode 26 are connected to each other at a ridge line portion of the second principal surface 20b and the side surface 20d, and are electrically connected to each other. In the present embodiment, the fourth connection electrode 24 and the sixth connection electrode 26 are integrally formed.

The first metal terminal T1 is disposed to oppose the fifth connection electrode 25 of the first substrate B1. The first metal terminal T1 is connected to the fifth connection electrode 25. The first metal terminal T1 is electrically connected with the first external electrode 3 of the multilayer capacitor C1 via the fifth connection electrode 25 and the first connection electrode 21. The first metal terminal T1 and the fifth connection electrode 25 are connected to each other by, for example, a solder (not illustrated).

The first metal terminal T1 includes a first connection portion 30 and a first leg portion 31. The first connection portion 30 opposes the fifth connection electrode 25 (side surface 20c). The fifth connection electrode 25 is connected to the first connection portion 30. The first connection portion 30 is directly fixed to one end portion side in the second direction D2 of the first substrate B1, and is electrically connected with the first connection electrode 21 via the fifth connection electrode 25. The first connection portion 30 extends in the first direction D1, and has a rectangular shape when viewed from the second direction D2.

The first leg portion 31 extends from one end of the first connection portion 30. The first leg portion 31 includes a first portion 31a and a second portion 31b. The first portion 31a extends in the first direction D1 from one end of the first connection portion 30. The first portion 31a extends in the same direction as the first connection portion 30 (the first direction D1), and the first connection portion 30 and the first portion 31a are disposed on the same plane.

The second portion 31b extends in the second direction D2 from one end of the first portion 31a, and has a rectangular shape when viewed from the first direction D1. The first portion 31a and the second portion 31b extend in the directions intersecting with each other (in the present embodiment, directions orthogonal to each other). The second portion 31b is connected to an electronic device ED (e.g., circuit board, electronic component, or the like). The second portion 31b is a mounted region connected to the electronic device ED.

The first portion 31a connects the first connection portion 30 and the second portion 31b to each other. The first portion 31a extends in the first direction D1 to connect between one end of the first connection portion 30 and one end of the second portion 31b. When viewed in the first direction D1, the first connection portion 30 and the second portion 31b are separated from each other by the length of the first portion 31a. The first connection portion 30 and the first leg portion 31 (the first and second portions 31a and 31b) are integrally formed. The first metal terminal T1 is made of, for example, metal material such as Fe—Ni alloy.

The second metal terminal T2 is disposed to oppose the sixth connection electrode 26 of the first substrate B1. The second metal terminal T2 opposes the first metal terminal T1 in such a manner as to sandwich the first substrate B1 between the second metal terminal T2 and the first metal terminal T1 in the second direction D2. The second metal terminal T2 is connected to the sixth connection electrode 26. The second metal terminal T2 is electrically connected with the fourth external electrode 15 of the overcurrent protection device CP1 via the sixth connection electrode 26 and the fourth connection electrode 24. The second metal terminal T2 and the sixth connection electrode 26 are connected to each other by, for example, a solder (not illustrated).

The second metal terminal T2 includes a second connection portion 40 and a second leg portion 41. The second connection portion 40 opposes the sixth connection electrode 26 (side surface 20d). The sixth connection electrode 26 is connected to the second connection portion 40. The second connection portion 40 is directly fixed to the other one end portion side in the second direction D2 of the first substrate B1, and is electrically connected with the fourth connection electrode 24 via the sixth connection electrode 26. The second connection portion 40 extends in the first direction D1, and has a rectangular shape when viewed from the second direction D2. The first connection portion 30 and the second connection portion 40 oppose each other in the second direction D2.

The second leg portion 41 extends from one end of the second connection portion 40. The second leg portion 41 includes a third portion 41a and a fourth portion 41b. The third portion 41a extends in the first direction D1 from one end of the second connection portion 40. The third portion 41a extends in the same direction as the second connection portion 40 (the first direction D1), and the second connection portion 40 and the third portion 41a are disposed on the substantially same plane. The first leg portion 31 and the second leg portion 41 oppose each other in the second direction D2.

The fourth portion 41b extends in the second direction D2 from one end of the third portion 41a, and has a rectangular shape when viewed from the first direction D1. The third portion 41a and the fourth portion 41b extend in the directions intersecting with each other (in the present embodiment, directions orthogonal to each other). The fourth portion 41b is connected to the electronic device ED. The fourth portion 41b is a mounted region connected to the electronic device ED. The fourth portion 41b and the second portion 31b are disposed on the substantially same plane.

The third portion 41a connects the second connection portion 40 and the fourth portion 41b to each other. The third portion 41a extends in the first direction D1 to connect between one end of the second connection portion 40 and one end of the fourth portion 41b. When viewed in the first direction D1, the second connection portion 40 and the fourth portion 41b are separated from each other by the length of the third portion 41a. The second connection portion 40 and the second leg portion 41 (the third and fourth portions 41a and 41b) are integrally formed. The second metal terminal T2 is made of, for example, metal material such as Fe—Ni alloy.

As illustrated in FIGS. 1 and 3, in the electronic component EC1, the multilayer capacitor C1 is disposed closer to the first leg portion 31 and the second leg portion 41 than the first substrate B1. When viewed from the third direction D3, the multilayer capacitor C1 is disposed in a space surrounded by the first and second metal terminal T1 and T2 and the first substrate B1. The first substrate B1 is disposed in such a manner that the first principal surface 20a opposes the second portion 31b and the fourth portion 41b. The first leg portion 31 (first portion 31a) and the first external electrode 3 of the multilayer capacitor C1 are separated from each other in the second direction D2. The second leg portion 41 (third portion 41a) and the second external electrode 5 of the multilayer capacitor C1 are separated from each other in the second direction D2.

The electronic component EC1 is mounted on the electronic device ED in a state in which the side surface 1d of the multilayer capacitor C1 opposes the electronic device ED. The electronic component EC1 is mounted in such a manner that the first direction D1 intersects with the electronic device ED. For example, the electronic component EC1 is solder-mounted on the electronic device ED. The first and second metal terminals T1 and T2 are connected to a land electrode (not illustrated) disposed on the electronic device ED. The land electrode is connected to a line (not illustrated).

In a state in which the electronic component EC1 is mounted on the electronic device ED, the first substrate B1 (multilayer capacitor C1 and overcurrent protection device CP1) is separated from the electronic device ED in the first direction D1. In the present embodiment, the multilayer capacitor C1 is disposed between the first substrate B1 and the electronic device ED.

As described above, in the present embodiment, the first connection portion 30 of the first metal terminal T1 and the first connection electrode 21 of the first substrate B1 are electrically connected to each other via the fifth connection electrode 25, and the first external electrode 3 of the multilayer capacitor C1 and the first connection electrode 21 are connected to each other. The second external electrode 5 of the multilayer capacitor C1 and the second connection electrode 22 of the first substrate B1 are connected to each other, the third external electrode 13 of the overcurrent protection device CP1 and the third connection electrode 23 of the first substrate B1 are connected to each other, and the second connection electrode 22 and the third connection electrode 23 are electrically connected to each other via the through-hole conductor TH. The fourth external electrode 15 of the overcurrent protection device CP1 and the fourth connection electrode 24 of the first substrate B1 are connected to each other, and the fourth connection electrode 24 and the second connection portion 40 of the second metal terminal T2 are electrically connected to each other via the sixth connection electrode 26. Thus, the multilayer capacitor C1 and the overcurrent protection device CP1 are connected in series between the first and second metal terminals T1 and T2. Because the multilayer capacitor C1 and the overcurrent protection device CP1 are connected in series, even if the multilayer capacitor C1 short-circuits, the overcurrent protection device CP1 prevents overcurrent from flowing between the first and second metal terminals T1 and T2.

The multilayer capacitor C1 is disposed on the first principal surface 20a side of the first substrate B1, and the overcurrent protection device CP1 is disposed on the second principal surface 20b side of the first substrate B1. Thus, the electronic component EC1 can employ a configuration in which the multilayer capacitor C1 and the overcurrent protection device CP1 overlap each other at least partially when viewed from the first direction D1, as in the present embodiment. Therefore, the design flexibility related to the layout of the multilayer capacitor C1 and the overcurrent protection device CP1 can be enhanced, and an increase in mounted area of the electronic component EC1 is suppressed.

When voltage is applied to the multilayer capacitor C1, mechanical strain arises in magnitude depending upon the applied voltage in the first element body 1 due to an electrostrictive effect. The mechanical strain generates electrostrictive vibration of the multilayer capacitor C1. When the multilayer capacitor C1 is directly mounted on the electronic device ED, and voltage is applied to the multilayer capacitor C1, electrostrictive vibration propagates to the electronic device ED. If the electrostrictive vibration propagates to the electronic device ED, the electronic device ED may vibrate, and vibration sound may be generated.

In the electronic component EC1, since the first metal terminal T1 includes the first leg portion 31, and the second metal terminal T2 includes the second leg portion 41, the first and second leg portions 31 and 41 absorb electrostrictive vibration. Thus, in the electronic component EC1, the propagation of electrostrictive vibration to the electronic device ED is suppressed. The generation of vibration sound is accordingly suppressed in the electronic device ED.

The second connection electrode 22 and the third connection electrode 23 are electrically connected to each other via the through-hole conductor TH penetrating through the substrate main body 20. Thus, in the electronic component EC1, for example, as compared with an electronic component in which a conductor that electrically connects a second connection electrode 22 and a third connection electrode 23 to each other is disposed on the surface of a substrate main body 20, a current path between the second connection electrode 22 and the third connection electrode 23 is short. Thus, in the electronic component EC1, lowering of resistance is achieved.

In the present embodiment, the overcurrent protection device CP1 is a PTC thermistor, and includes the third and fourth internal electrodes 17 and 19 opposing each other. The third internal electrodes 17 are connected to the third external electrode 13, and the fourth internal electrodes 19 are connected to the fourth external electrode 15. If the short circuit of the multilayer capacitor C1 causes overcurrent to flow between the first and second metal terminals T1 and T2, the resistance between the third and fourth internal electrodes 17 and 19 becomes higher. Thus, current is difficult to flow between the third and fourth internal electrodes 17 and 19.

The multilayer capacitor C1 is larger than the overcurrent protection device CP1. In the electronic component EC1, for example, an area where the first and second internal electrodes 7 and 9 oppose each other can be set to be larger. Thus, the capacity of the multilayer capacitor C1 can be easily increased to large capacity.

In the present embodiment, the multilayer capacitor C1 and the overcurrent protection device CP1 overlap each other at least partially when viewed from the first direction D1. In the electronic component EC1, as compared with an electronic component in which a multilayer capacitor C1 and an overcurrent protection device CP1 do not overlap each other when viewed from the first direction D1, the size of the first substrate B1 when viewed from the first direction D1 can be set to be smaller. As a result, the mounting area of the electronic component EC1 can be reduced.

Figure 7:
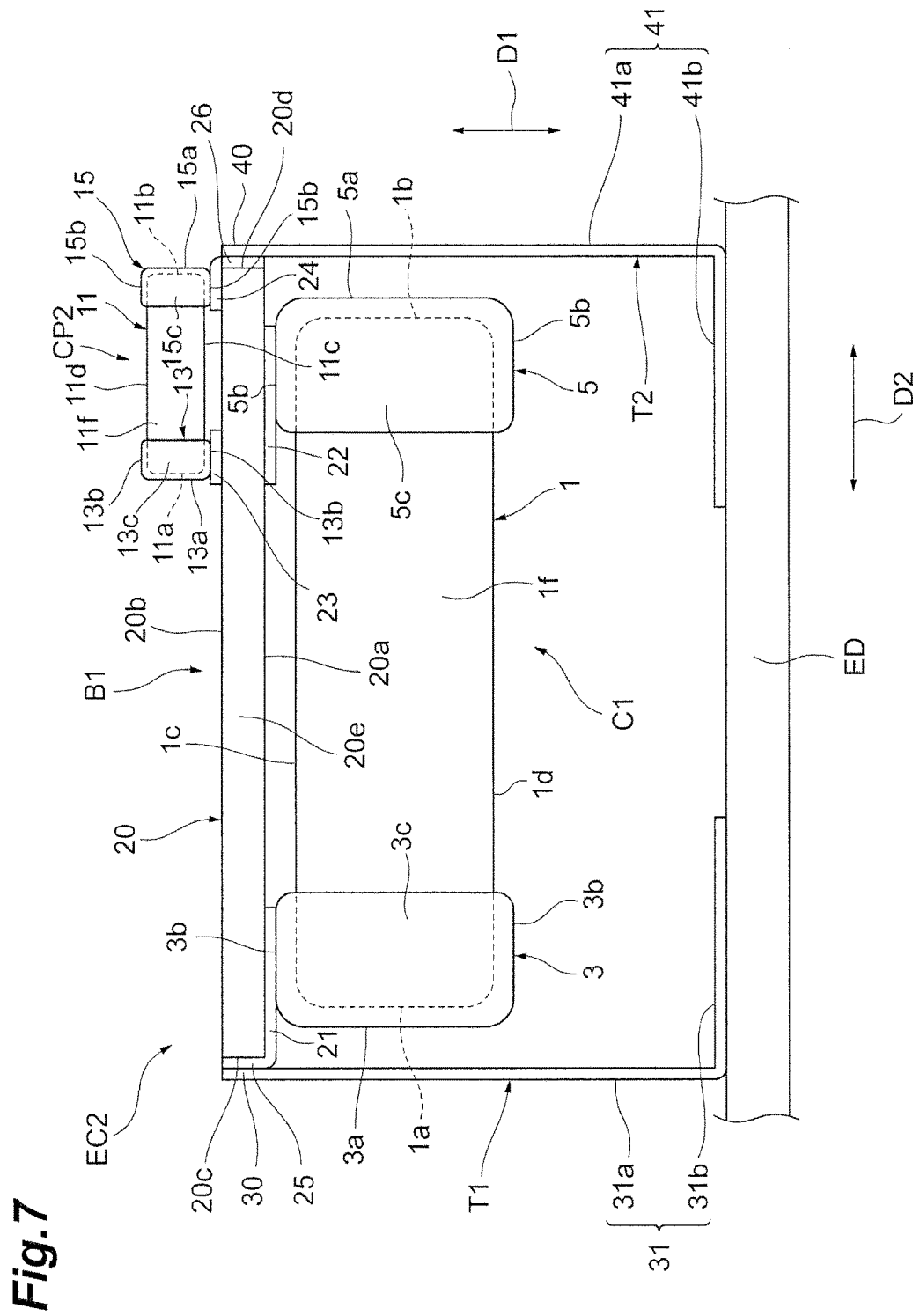
FIG. 7 is a side view illustrating an electronic component according to a modified example of the present embodiment.
Figure 8:
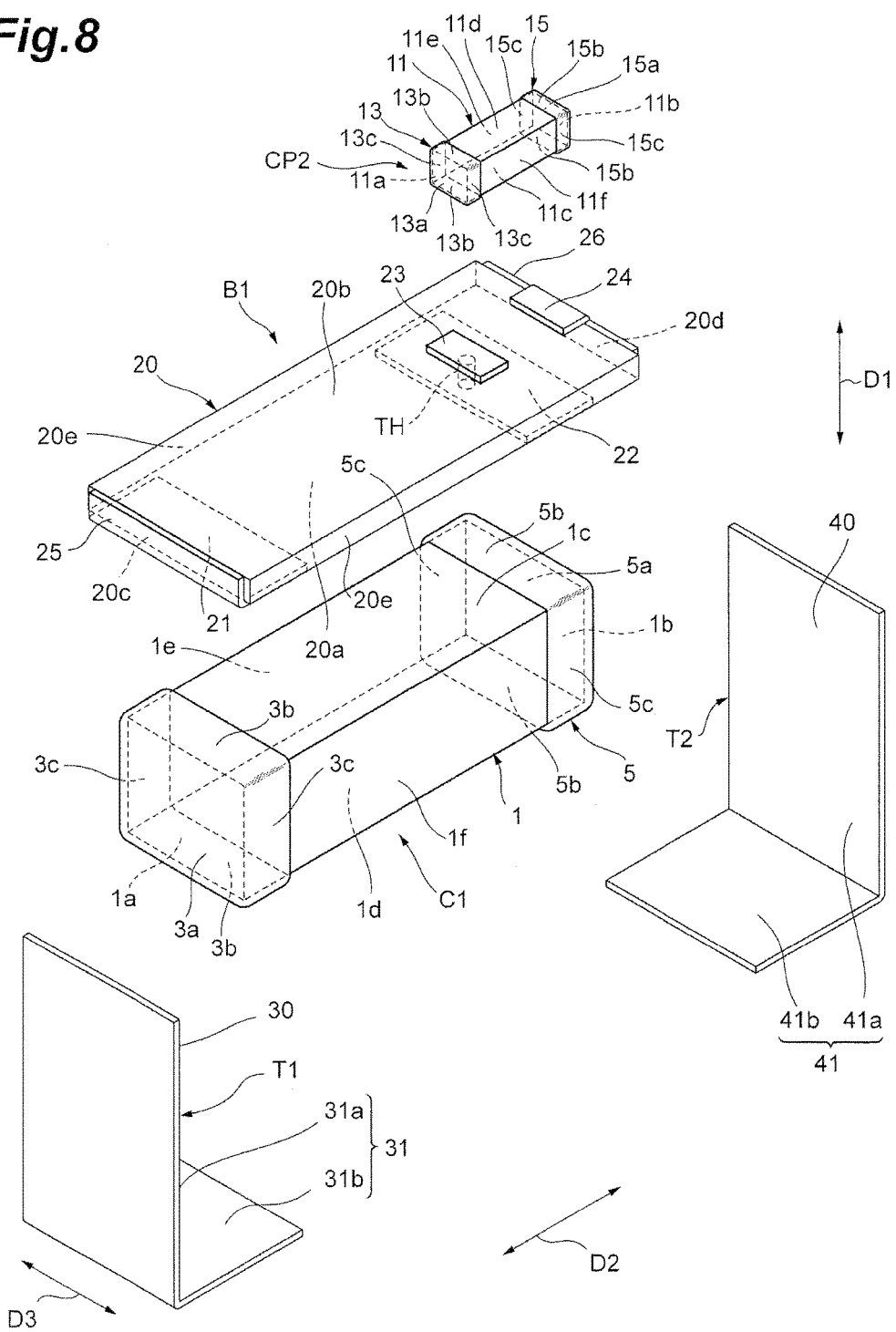
FIG. 8 is an exploded perspective view illustrating the electronic component according to the modified example.
Figure 9:
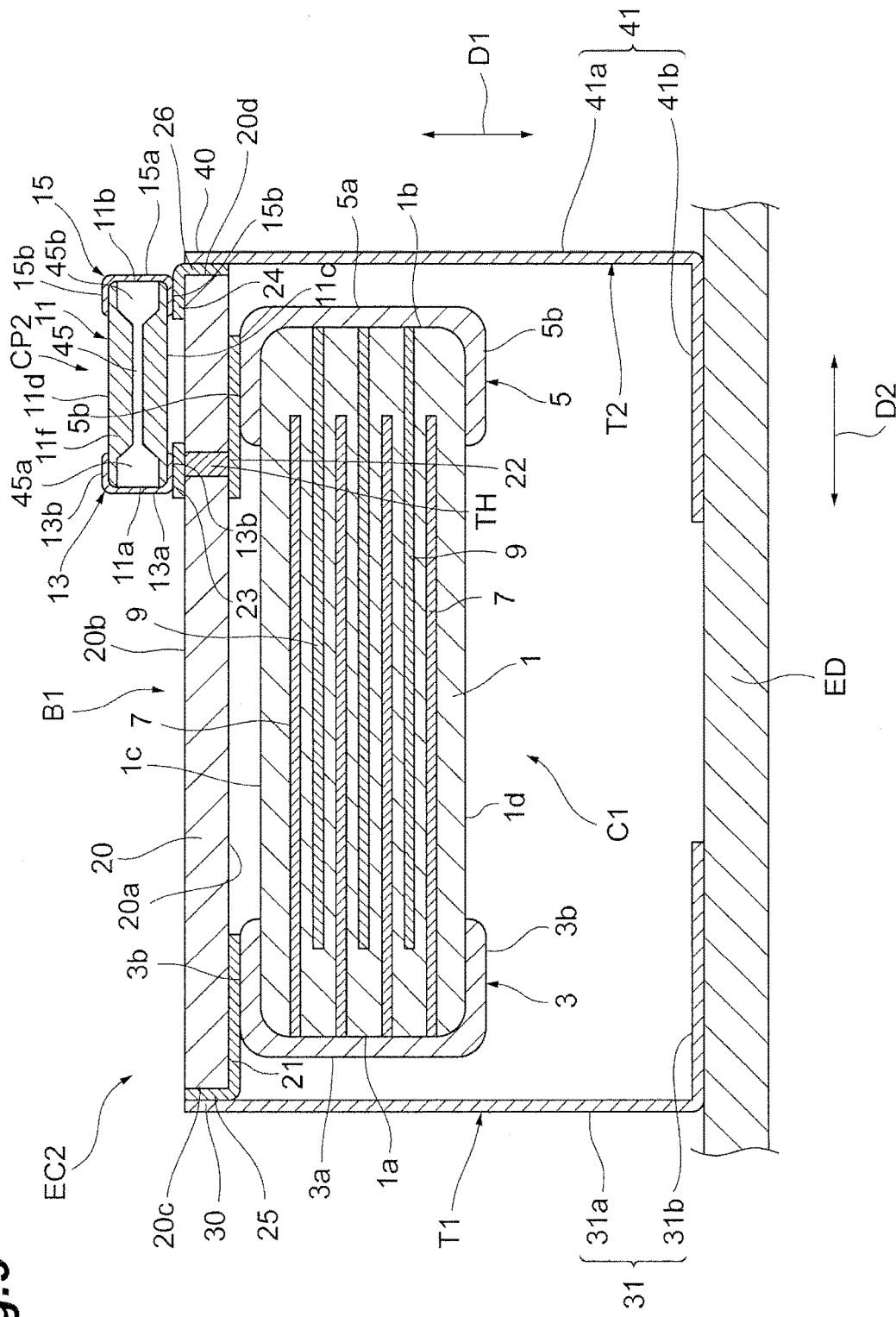
FIG. 9 is a diagram for illustrating a cross-sectional configuration of the electronic component according to the modified example.

Next, a configuration of an electronic component EC2 according to a modified example of the present embodiment will be described with reference to FIGS. 7 to 9. FIG. 7 is a side view illustrating the electronic component according to the modified example. FIG. 8 is an exploded perspective view illustrating the electronic component according to the modified example. FIG. 9 is a diagram for illustrating a cross-sectional configuration of the electronic component according to the modified example. The modified example differs from the above-described embodiment in the configuration of an overcurrent protection device.

As illustrated in FIGS. 7 to 9, the electronic component EC2 includes the multilayer capacitor C1, an overcurrent protection device CP2, the first substrate B1, the first metal terminal T1, and the second metal terminal T2. Similarly to the above-described embodiment, the multilayer capacitor C1 includes the first element body 1, the first external electrode 3, the second external electrode 5, the plurality of first internal electrodes 7, and the plurality of second internal electrodes 9. The first external electrode 3 and the second external electrode 5 are disposed on the outer surfaces of the first element body 1. The plurality of first internal electrodes 7 and the plurality of second internal electrodes 9 are disposed in the first element body 1.

The overcurrent protection device CP2 includes a second element body 11, and a third external electrode 13 and a fourth external electrode 15 that are disposed on the outer surfaces of the second element body 11. In the modified example, the overcurrent protection device CP2 is a fuse. The second element body 11 includes third and fourth end surfaces 11a and 11b opposing each other, a pair of side surfaces 11c and 11d opposing each other and each having an oblong shape, and a pair of side surfaces 11e and 11f opposing each other and each having an oblong shape. The third and fourth end surfaces 11a and 11b, and the 4 side surfaces 11c, 11d, 11e, and 11f constitute the outer surfaces of the second element body 11.

In the overcurrent protection device CP2, the second element body 11 includes a plurality of insulator layers stacked in a direction in which the side surfaces 11e and 11f oppose each other. In the second element body 11 of the overcurrent protection device CP2, the stacking direction of the plurality of insulator layers corresponds to the third direction D3. Each insulator layer includes a sintered body of a ceramic green sheet containing insulator material. The insulator layers are so integrated that no boundary can be visually recognized between the insulator layers. The second element body 11 may include a plurality of insulator layers stacked in a direction in which the side surfaces 11c and 11d oppose each other.

Similarly to the overcurrent protection device overcurrent protection device CP1, the overcurrent protection device CP2 also includes a protection circuit element disposed in the second element body 11. As illustrated in FIG. 9, the overcurrent protection device CP2 includes an inner conductor 45. The inner conductor 45 corresponds to the protection circuit element. The inner conductor 45 includes a first end portion 45a exposed to the third end surface 11a, and a second end portion 45b exposed to the fourth end surface 11b. The inner conductor 45 is made of soluble metal.

The first end portion 45a is connected to the third external electrode 13 (the electrode portion 13a). The electrode portion 13a thoroughly covers a portion of the first end portion 45a that is exposed to the third end surface 11a. The first end portion 45a is directly connected to the third external electrode 13. The second end portion 45b is connected to the fourth external electrode 15 (the electrode portion 15a). The electrode portion 15a thoroughly covers a portion of the second end portion 45b that is exposed to the fourth end surface 11b. The second end portion 45b is directly connected to the fourth external electrode 15. The third external electrode 13 and the fourth external electrode 15 are electrically to each other via the inner conductor 45.

In the present embodiment, the overcurrent protection device CP2 is mounted on the first substrate B1 in such a manner that the side surface 11c and the second principal surface 20b oppose each other in the first direction D1. The overcurrent protection device CP2 is disposed on the second principal surface 20b side of the first substrate B1. The first substrate B1 is disposed between the multilayer capacitor C1 and the overcurrent protection device CP2 when viewed in the first direction D1. The multilayer capacitor C1 and the overcurrent protection device CP2 overlap each other at least partially when viewed from the first direction D1.

As described above, in the modified example, the first connection portion 30 of the first metal terminal T1 and the first connection electrode 21 of the first substrate B1 are electrically connected to each other via the fifth connection electrode 25, and the first external electrode 3 of the multilayer capacitor C1 and the first connection electrode 21 are connected to each other. The second external electrode 5 of the multilayer capacitor C1 and the second connection electrode 22 of the first substrate B1 are connected to each other, the third external electrode 13 of the overcurrent protection device CP2 and the third connection electrode 23 of the first substrate B1 are connected to each other, and the second connection electrode 22 and the third connection electrode 23 are electrically connected to each other via the through-hole conductor TH. The fourth external electrode 15 of the overcurrent protection device CP2 and the fourth connection electrode 24 of the first substrate B1 are connected to each other, and the fourth connection electrode 24 and the second connection portion 40 of the second metal terminal T2 are electrically connected to each other via the sixth connection electrode 26. Thus, the multilayer capacitor C1 and the overcurrent protection device CP2 are connected in series between the first and second metal terminals T1 and T2. Because the multilayer capacitor C1 and the overcurrent protection device CP2 are connected in series, even if the multilayer capacitor C1 short-circuits, the overcurrent protection device CP2 prevents overcurrent from flowing between the first and second metal terminals T1 and T2.

In the modified example, the overcurrent protection device CP2 is a fuse, and includes the inner conductor 45. The first end portion 45a of the inner conductor 45 is connected to the third external electrode 13, and the second end portion 45b of the inner conductor 45 is connected to the fourth external electrode 15. If the short circuit of the multilayer capacitor C1 causes overcurrent to flow between the first and second metal terminals T1 and T2, the inner conductor 45 made of soluble metal melts down. Thus, current does not flow between the first and second metal terminals T1 and T2.

Similarly to the above-described embodiment, also in the electronic component EC2, the first and second leg portions 31 and 41 absorb electrostrictive vibration, so that the propagation of electrostrictive vibration to the electronic device ED is suppressed. Thus, in the electronic device ED, the generation of vibration sound is suppressed.

Similarly to the above-described embodiment, the electronic component EC2 can also employ a configuration in which the multilayer capacitor C1 and the overcurrent protection device CP2 overlap each other at least partially when viewed from the first direction D1. Thus, the design flexibility related to the layout of the multilayer capacitor C1 and the overcurrent protection device CP2 can be enhanced, and an increase in mounted area of the electronic component EC2 is suppressed.

Figure 10:
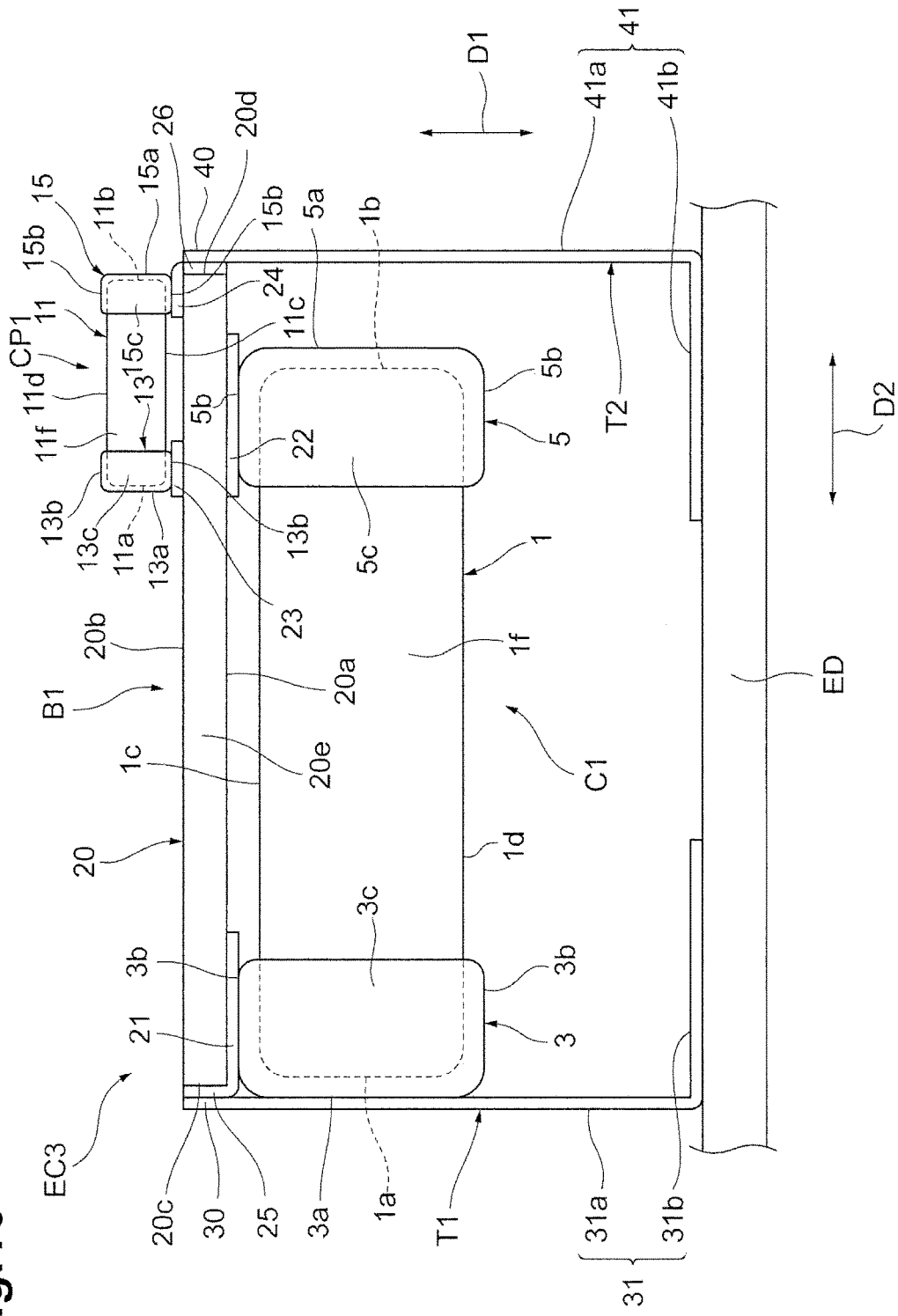
FIG. 10 is a side view illustrating an electronic component according to a modified example of the present embodiment.

Also in the electronic component EC2, the multilayer capacitor C1 is larger than the overcurrent protection device CP2. Thus, for example, an area where the first and second internal electrodes 7 and 9 oppose each other can be set to be larger. Thus, the capacity of the multilayer capacitor C1 can be easily increased to large capacity Next, a configuration of an electronic component EC3 according to a modified example of the present embodiment will be described with reference to FIG. 10. FIG. 10 is a side view illustrating the electronic component according to the modified example.

As illustrated in FIG. 10, the electronic component EC3 includes the multilayer capacitor C1, the overcurrent protection device CP1, the first substrate B1, the first metal terminal T1, and the second metal terminal T2. The first external electrode 3 of the multilayer capacitor C1 is connected with the first metal terminal T1. The first external electrode 3 and the first metal terminal T1 are connected to each other by, for example, a solder (not illustrated).

The multilayer capacitor C1 is disposed closer to the first and second leg portions 31 and 41 than the first substrate B1. The first external electrode 3 (electrode portion 3a) is connected with the first leg portion 31 (first portion 31a). In the electronic component EC3, for example, the support strength of the multilayer capacitor C1 is higher and the multilayer capacitor C1 is more difficult to fall, as compared with an electronic component in which a first external electrode 3 is not connected with a first leg portion 31.

Figure 11:
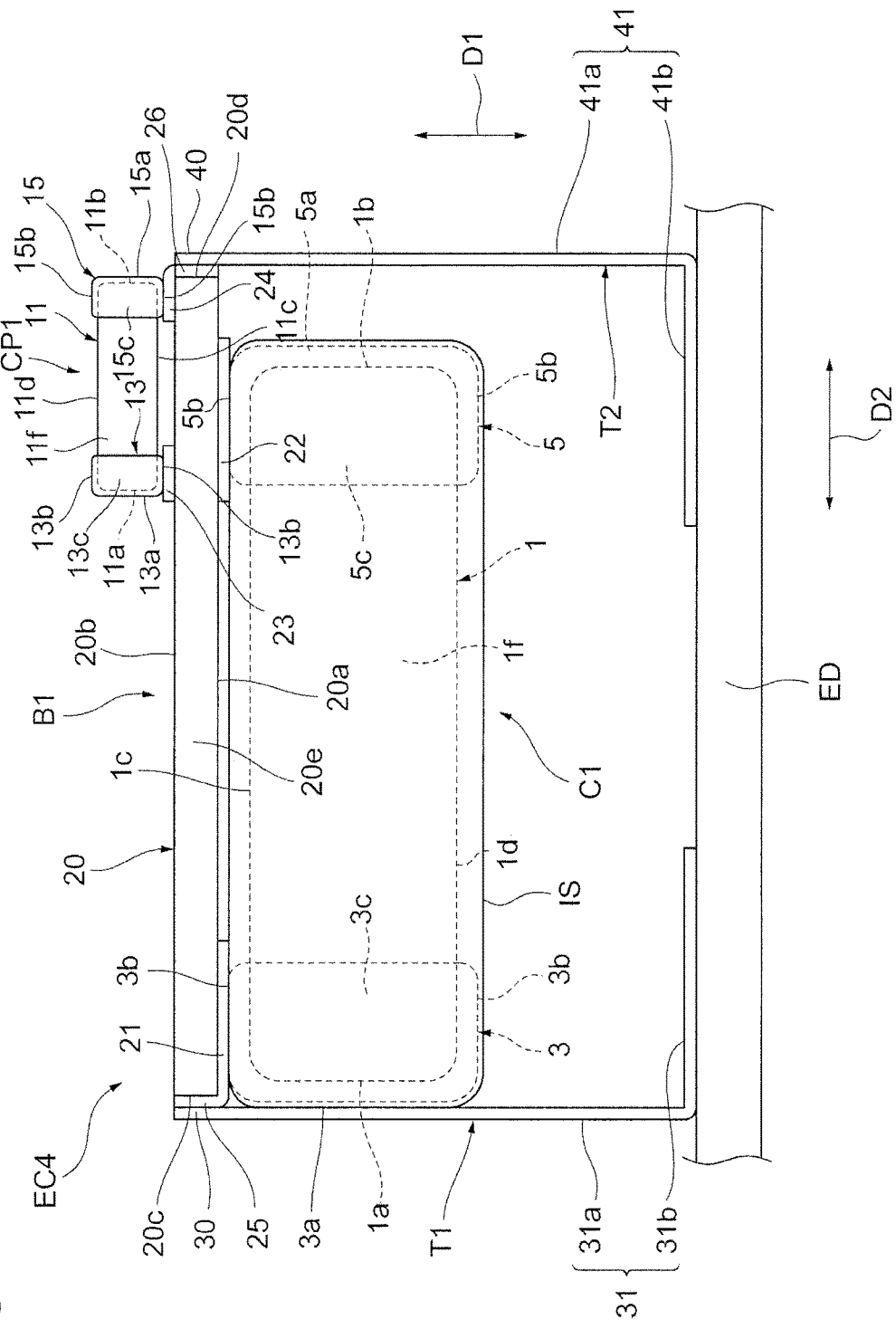
FIG. 11 is a side view illustrating an electronic component according to a modified example of the present embodiment.
Figure 12:
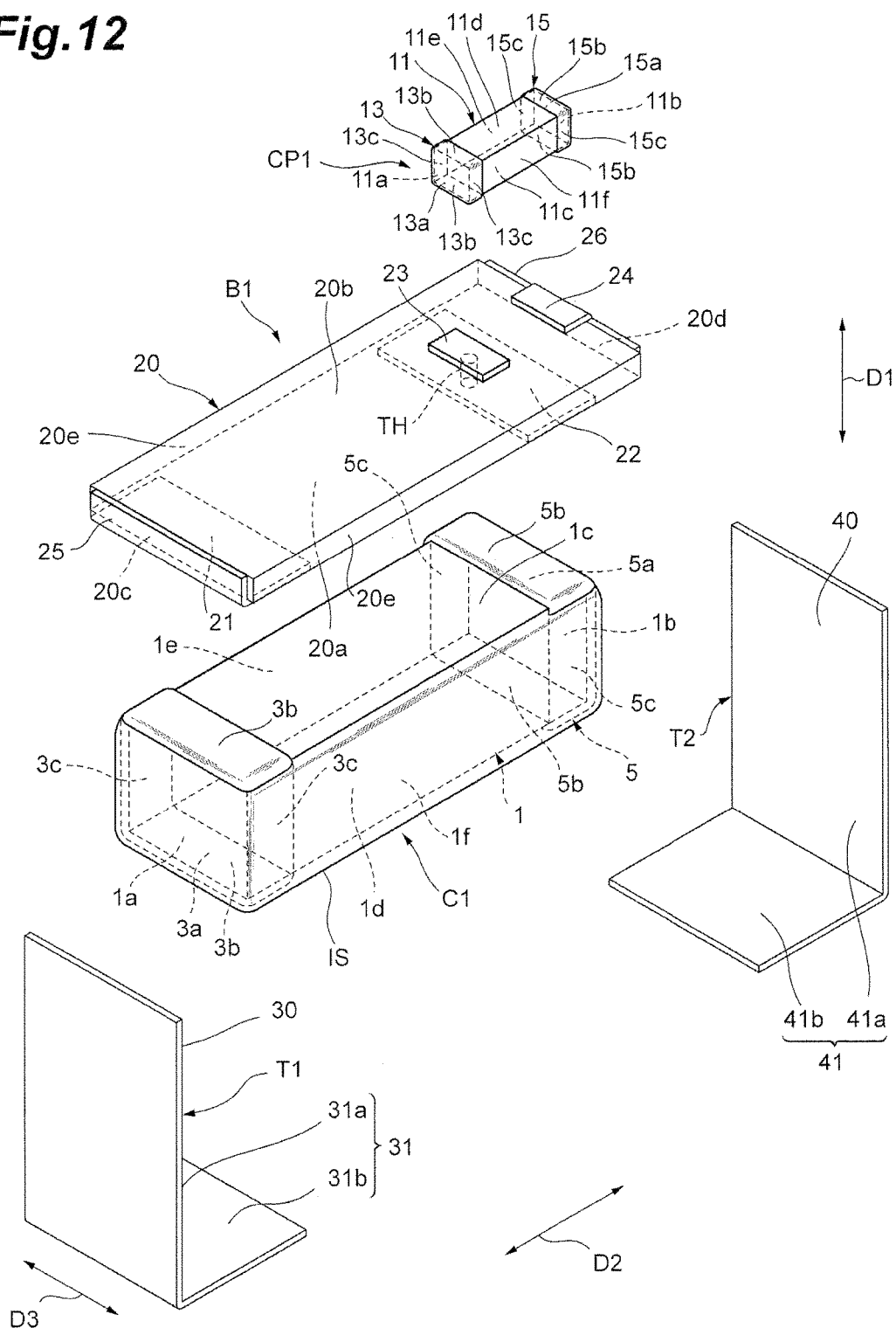
FIG. 12 is an exploded perspective view illustrating the electronic component according to the modified example.
Figure 13:
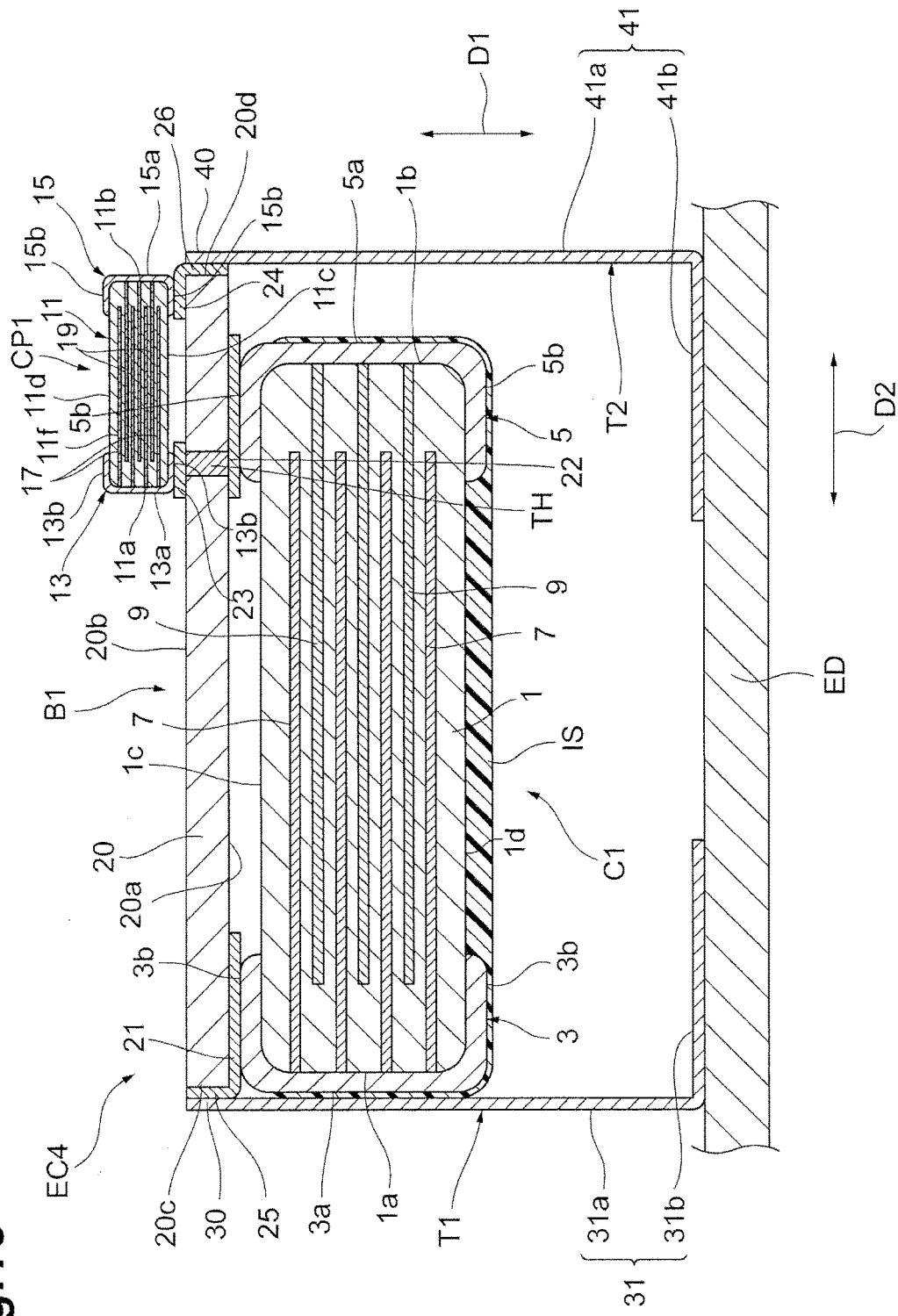
FIG. 13 is a diagram for illustrating a cross-sectional configuration of the electronic component according to the modified example.

Next, a configuration of an electronic component EC4 according to a modified example of the present embodiment will be described with reference to FIGS. 11 to 13. FIG. 11 is a side view illustrating the electronic component according to the modified example. FIG. 12 is an exploded perspective view illustrating the electronic component according to the modified example. FIG. 13 is a diagram for illustrating a cross-sectional configuration of the electronic component according to the modified example. The modified example differs from the above-described embodiment in the configuration of a multilayer capacitor C1.

As illustrated in FIGS. 11 to 13, the electronic component EC4 includes a multilayer capacitor C1, the overcurrent protection device CP1, the first substrate B1, the first metal terminal T1, and the second metal terminal T2. The multilayer capacitor C1 includes the first element body 1, the first external electrode 3, the second external electrode 5, the plurality of first internal electrodes 7, the plurality of second internal electrodes 9, and an insulator IS. The insulator IS is made of electrical insulating material (e.g., insulating resin or insulating glass, etc.).

The insulator IS covers the electrode portion 3a disposed on the first end surface 1a, the electrode portion 5a disposed on the second end surface 1b, the electrode portions 3b and 5b disposed on the side surface 1d, and the electrode portions 3c and 5c disposed on the side surfaces 1e and 1f. The insulator IS also covers a region on the side surface 1d that is exposed from the electrode portions 3b and 5b, and regions on the side surfaces 1e and 1f that are exposed from the electrode portions 3c and 5c. The electrode portions 3b and 5b disposed on the side surface 1c are exposed from the insulator IS. The region on the side surface 1c that is exposed from the electrode portions 3b and 5b is also exposed from the insulator IS.

In the electronic component EC4, the electrode portion 3b of the first external electrode 3 that is disposed on the side surface 1d, and the electrode portion 5b of the second external electrode 5 that is disposed on the side surface 1d are covered with the insulator IS. Thus, even if the multilayer capacitor C1 falls, the insulator IS prevents the multilayer capacitor C1 from contacting another region (first and second metal terminals T1 and T2, or the electronic device ED). As a result, when the multilayer capacitor C1 falls, short circuit is difficult to occur. In the electronic component EC4, the electrode portions 3c of the first external electrode 3 that are disposed on the side surfaces 1e and 1f, and the electrode portions 5c of the second external electrode 5 that are disposed on the side surfaces 1e and 1f are also covered with the insulator IS. Thus, when the multilayer capacitor C1 falls, short circuit is more difficult to occur.

In the electronic component EC4, the electrode portion 5a of the second external electrode 5 that is disposed on the second end surface 1b is covered with the insulator IS. Thus, because the insulator IS is disposed between the second metal terminal T2 and the second external electrode 5 of the multilayer capacitor C1, short circuit is difficult to be caused by the contact between the second metal terminal T2 and the second external electrode 5.

Figure 14:
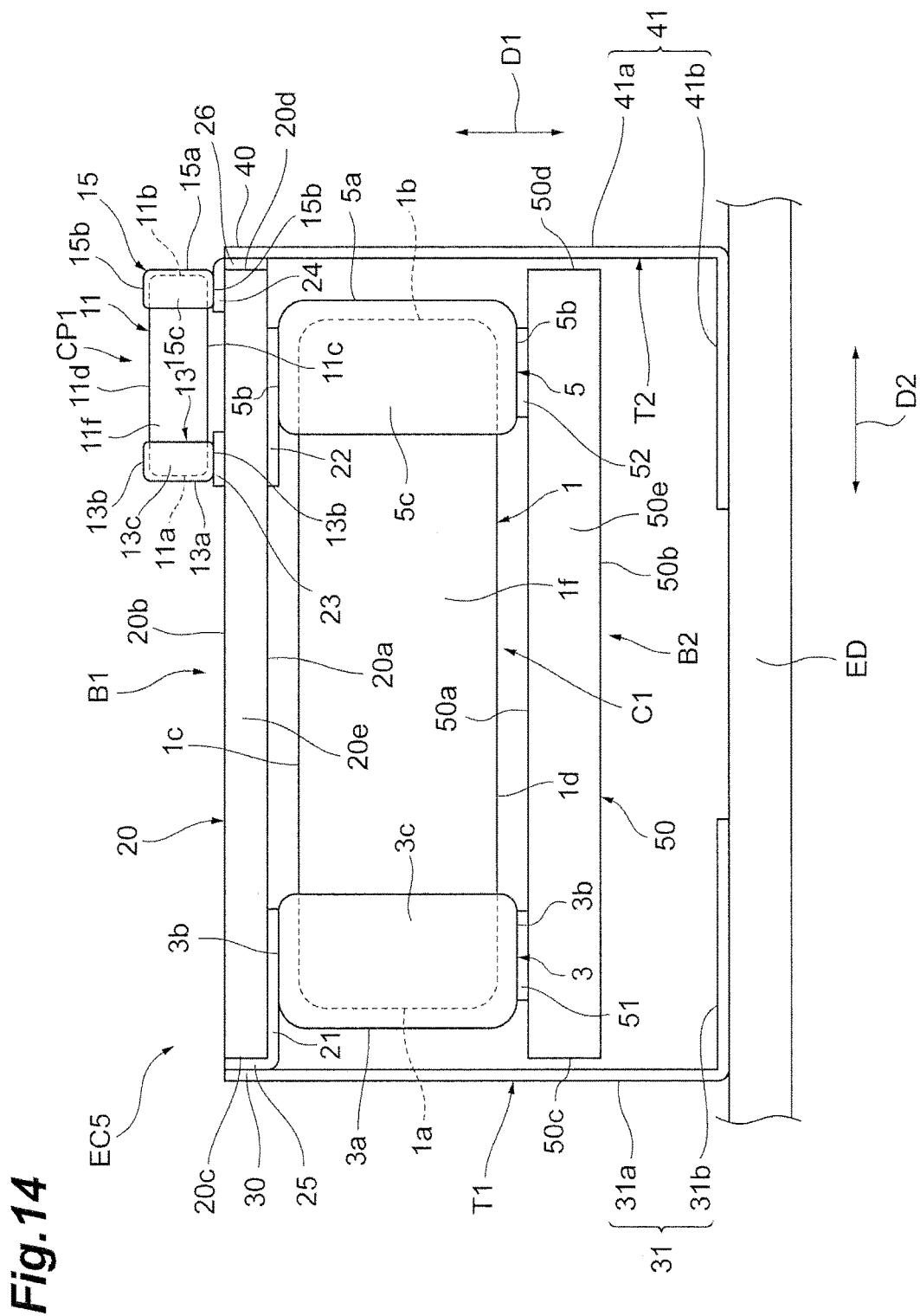
FIG. 14 is a side view illustrating an electronic component according to a modified example of the present embodiment.
Figure 15:
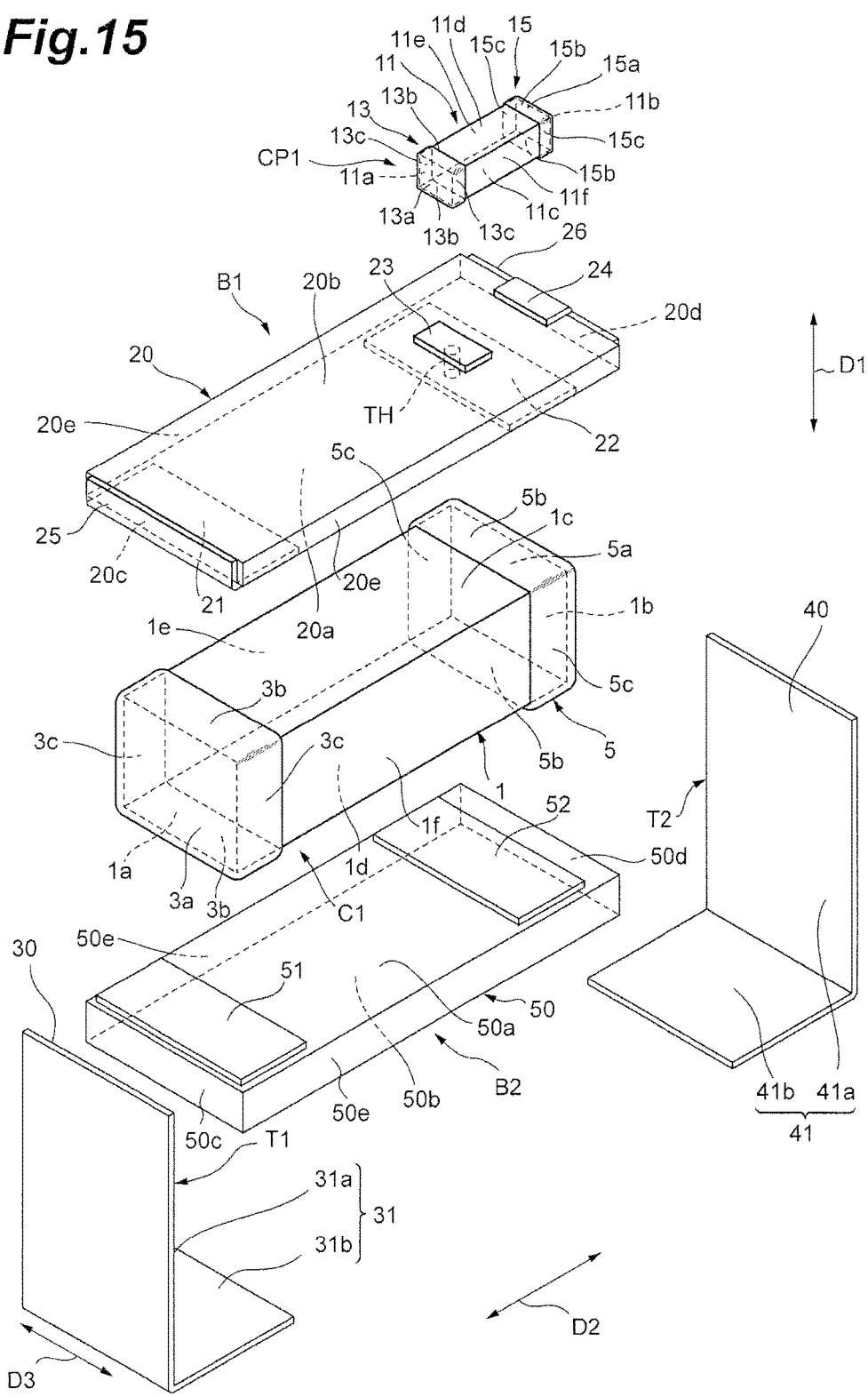
FIG. 15 is an exploded perspective view illustrating the electronic component according to the modified example.

Next, a configuration of an electronic component EC5 according to a modified example of the present embodiment will be described with reference to FIGS. 14 and 15. FIG. 14 is a side view illustrating the electronic component according to the modified example. FIG. 15 is an exploded perspective view illustrating the electronic component according to the modified example.

As illustrated in FIGS. 14 and 15, the electronic component EC5 includes the multilayer capacitor C1, the overcurrent protection device CP1, the first substrate B1, a second substrate B2, the first metal terminal T1, and the second metal terminal T2.

The second substrate B2 includes a substrate main body 50 and a pair of conductors 51 and 52. The pair of conductors 51 and 52 is disposed on the outer surface of the substrate main body 50. The substrate main body 50 has an electrical insulation property. The substrate main body 50 is made of, for example, electrical insulating resin such as glass epoxy resin.

The substrate main body 50 has an approximately-rectangular shape in a planar view. The substrate main body 50 includes a planar first principal surface 50a and a planar second principal surface 50b opposing each other, a pair of planar side surfaces 50c and 50d opposing each other, and a pair of planar side surfaces 50e opposing each other. The first principal surface 50a and the second principal surface 50b, and the four side surfaces 50c, 50d, and 50e constitute the outer surfaces of the substrate main body 50. The direction in which the first and second principal surfaces 50a and 50b oppose each other corresponds to the first direction D1. The direction in which the side surfaces 50c and 50d oppose each other corresponds to the second direction D2. The direction in which the pair of side surfaces 50e oppose each other corresponds to the third direction D3.

The length in the second direction D2 of the substrate main body 50 is larger than the length in the second direction D2 of the multilayer capacitor C1. The length in the third direction D3 of the substrate main body 50 is larger than the length in the third direction D3 of the multilayer capacitor C1.

The pair of side surfaces 50c and 50d extends in the first direction D1 to connect between the first and second principal surfaces 50a and 50b. The pair of side surfaces 50c and 50d extends also in the third direction D3. The pair of side surfaces 50e extends in the first direction D1 to connect between the first and second principal surfaces 50a and 50b. The pair of side surfaces 50e extends also in the second direction D2. The first principal surface 50a and the second principal surface 50b have an oblong shape with a long side direction corresponding to the second direction D2 and a short side direction corresponding to the third direction D3.

The pair of conductors 51 and 52 is disposed on the first principal surface 50a. On the first principal surface 50a, the pair of conductors 51 and 52 are separated from each other in the second direction D2. When viewed in the second direction D2, the conductor 51 is disposed closer to the side surface 50c than the center in the second direction D2 of the first principal surface 50a. The conductor 51 is separated from an end on the side surface 50c side of the first principal surface 50a. When viewed in the second direction D2, the conductor 52 is disposed closer to the side surface 50d than the center in the second direction D2 of the first principal surface 50a. The conductor 52 is separated from an end on the side surface 50d side of the first principal surface 50a.

The first external electrode 3 of the multilayer capacitor C1 is connected to the conductor 51. The conductor 51 and the first external electrode 3 are connected to each other by, for example, a solder (not illustrated). The second external electrode 5 of the multilayer capacitor C1 is connected to the conductor 52. The conductor 52 and the second external electrode 5 are connected to each other by, for example, a solder (not illustrated). The second substrate B2 is directly fixed to the multilayer capacitor C1.

The multilayer capacitor C1 is disposed on the first principal surface 50a side of the second substrate B2, and is mounted not only on the first substrate B1 but also on the second substrate B2. In the present embodiment, the multilayer capacitor C1 is mounted on the second substrate B2 in such a manner that the side surface 1d and the first principal surface 50a oppose each other in the first direction D1. In the first direction D1, the multilayer capacitor C1 is disposed between the first substrate B1 and the second substrate B2.

The second substrate B2 is separated from the first metal terminal T1 and the second metal terminal T2. The side surface 50c of the second substrate B2 is separated from and opposes the first leg portion 31 (first portion 31a) of the first metal terminal T1. The side surface 50d of the second substrate B2 is separated from and opposes the second leg portion 41 (third portion 41a) of the second metal terminal T2. The length in the second direction D2 of the second substrate B2 is smaller than the length in the second direction D2 of the first substrate B1.

Figure 16:
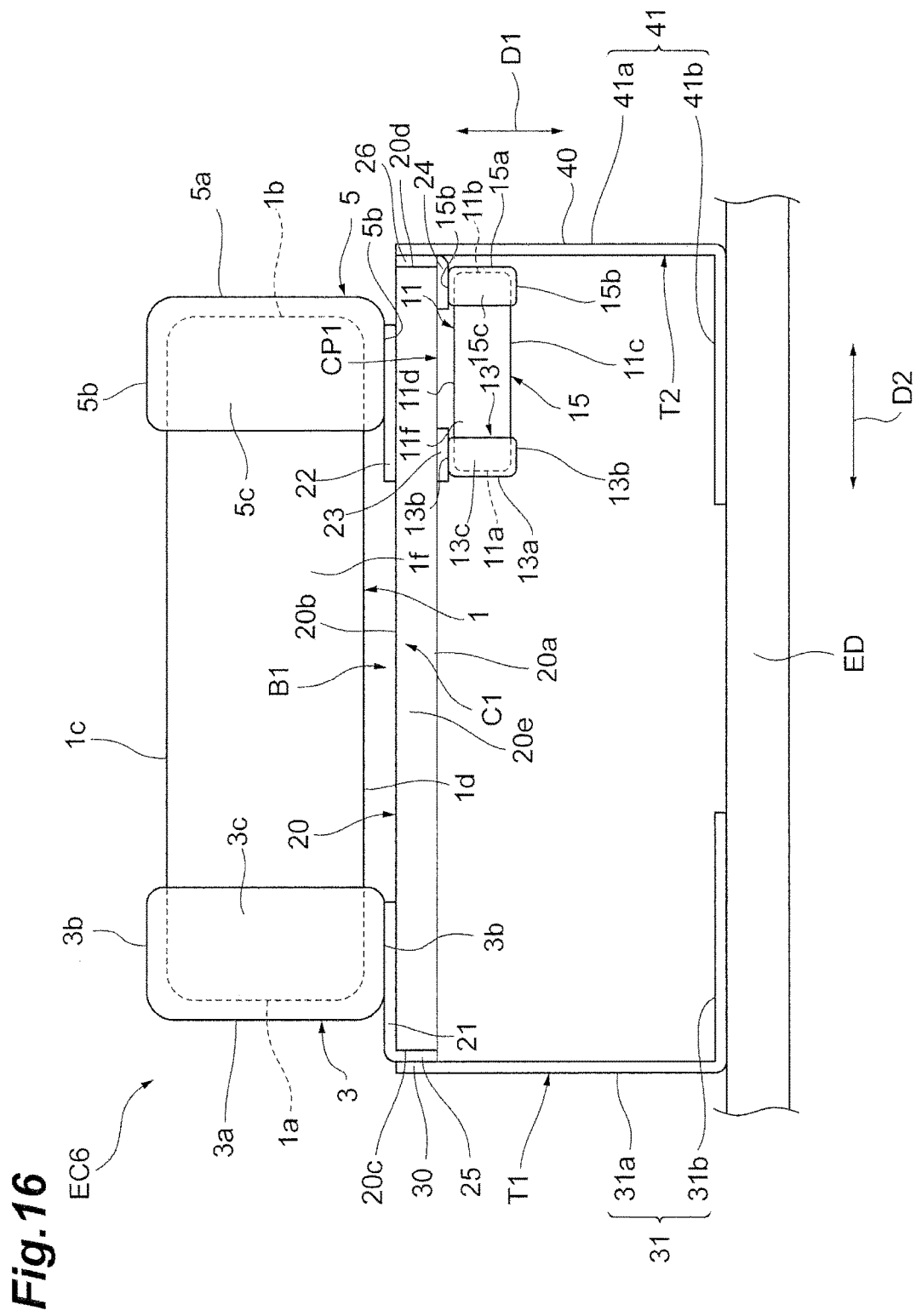
FIG. 16 is a side view illustrating an electronic component according to a modified example of the present embodiment.
Figure 17:
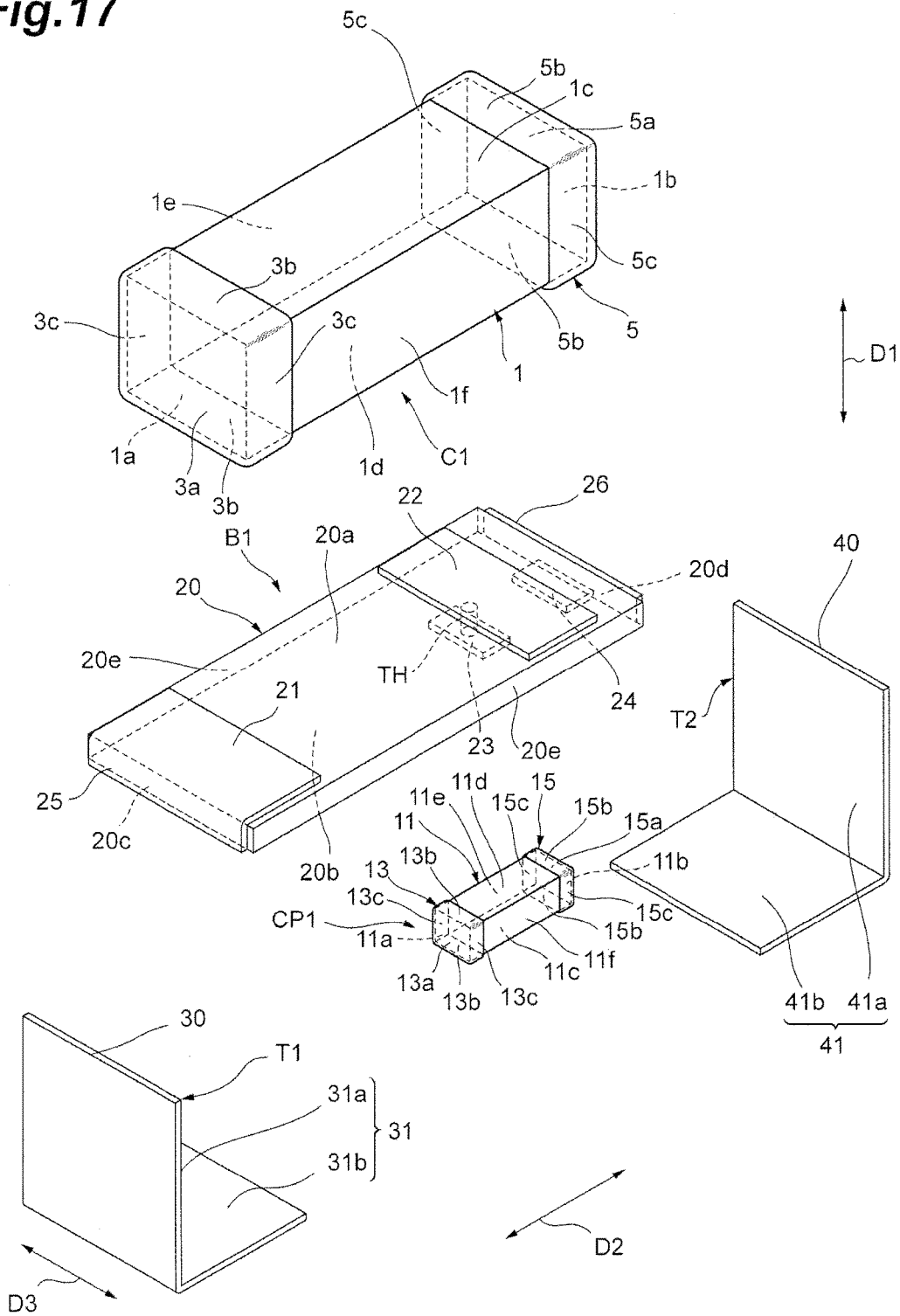
FIG. 17 is an exploded perspective view illustrating the electronic component according to the modified example.

In the modified example, even if the multilayer capacitor C1 falls, the second substrate B2 prevents the multilayer capacitor C1 from contacting another region. Thus, short circuit is difficult to occur. Because the second substrate B2 is separated from the first and second metal terminals T1 and T2, absorption of electrostrictive vibration in the first and second leg portions 31 and 41 is not disturbed. Thus, the propagation of electrostrictive vibration to the electronic device can be surely suppressed Next, a configuration of an electronic component EC6 according to a modified example of the present embodiment will be described with reference to FIGS. 16 and 17. FIG. 16 is a side view illustrating the electronic component according to the modified example. FIG. 17 is an exploded perspective view illustrating the electronic component according to the modified example.

As illustrated in FIGS. 16 and 17, the electronic component EC6 includes the multilayer capacitor C1, the overcurrent protection device CP1, the first substrate B1, the first metal terminal T1, and the second metal terminal T2. As described above, the overcurrent protection device CP1 is smaller than the multilayer capacitor C1.

In the electronic component EC6, the overcurrent protection device CP1 is disposed closer to the first and second leg portions 31 and 41 than the first substrate B1. When viewed from the third direction D3, the overcurrent protection device CP1 is disposed in a space surrounded by the first and second metal terminals T1 and T2 and the first substrate B1. The first substrate B1 is disposed in such a manner that the second principal surface 20b opposes the second portion 31b and the fourth portion 41b. The first leg portion 31 (first portion 31a) and the third external electrode 13 of the overcurrent protection device CP1 are separated from each other in the second direction D2. The second leg portion 41 (third portion 41a) and the fourth external electrode 15 of the overcurrent protection device CP1 are separated from each other in the second direction D2.

The electronic component EC6 is mounted on the electronic device ED in a state in which the side surface 11d of the overcurrent protection device CP1 opposes the electronic device ED. In a state in which the electronic component EC6 is mounted on the electronic device ED, the first substrate B1 (multilayer capacitor C1 and overcurrent protection device CP1) is separated from the electronic device ED in the first direction D1. In the present embodiment, the overcurrent protection device CP1 is disposed between the first substrate B1 and the electronic device ED.

In the modified example, the overcurrent protection device CP1 being smaller than the multilayer capacitor C1 is disposed closer to the first and second leg portions 31 and 41 than the first substrate B1. The multilayer capacitor C1 has larger weight as compared with that of the overcurrent protection device CP1. Thus, if the multilayer capacitor C1 is disposed closer to the first and second leg portions 31 and 41 than the first substrate B1, the multilayer capacitor C1 possibly falls due to its own weight. The overcurrent protection device CP1 has smaller weight than that of the multilayer capacitor C1. Thus, even if the overcurrent protection device CP1 is disposed closer to the first and second leg portions 31 and 41 than the first substrate B1, the overcurrent protection device CP1 is difficult to fall.

Figure 18:
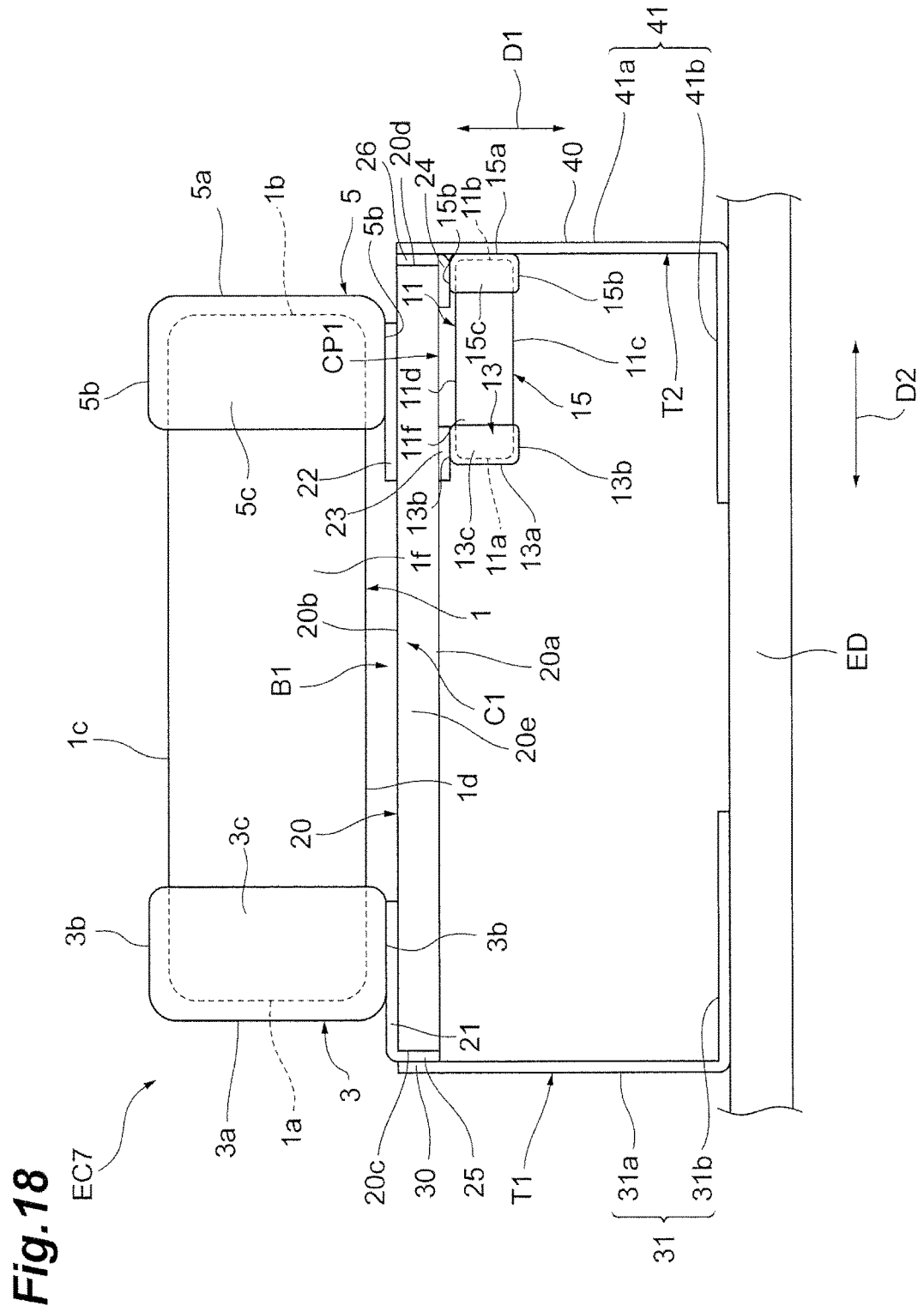
FIG. 18 is a side view illustrating an electronic component according to a modified example of the present embodiment.

Next, a configuration of an electronic component EC7 according to a modified example of the present embodiment will be described with reference to FIG. 18. FIG. 18 is a side view illustrating the electronic component according to the modified example.

As illustrated in FIG. 18, the electronic component EC7 includes the multilayer capacitor C1, the overcurrent protection device CP1, the first substrate B1, the first metal terminal T1, and the second metal terminal T2. The fourth external electrode 15 of the overcurrent protection device CP1 is connected with second metal terminal T2. The fourth external electrode 15 and the second metal terminal T2 are connected to each other by, for example, a solder (not illustrated).

The overcurrent protection device CP1 is disposed closer to the first and second leg portions 31 and 41 than the first substrate B1. The fourth external electrode 15 (electrode portion 15a) is connected with the second leg portion 41 (third portion 41a). With this configuration, in the electronic component EC7, for example, the support strength of the overcurrent protection device CP1 is higher and the overcurrent protection device CP1 is more difficult to fall, as compared with an electronic component in which a fourth external electrode 15 is not connected with a second leg portion 41.

Figure 19:
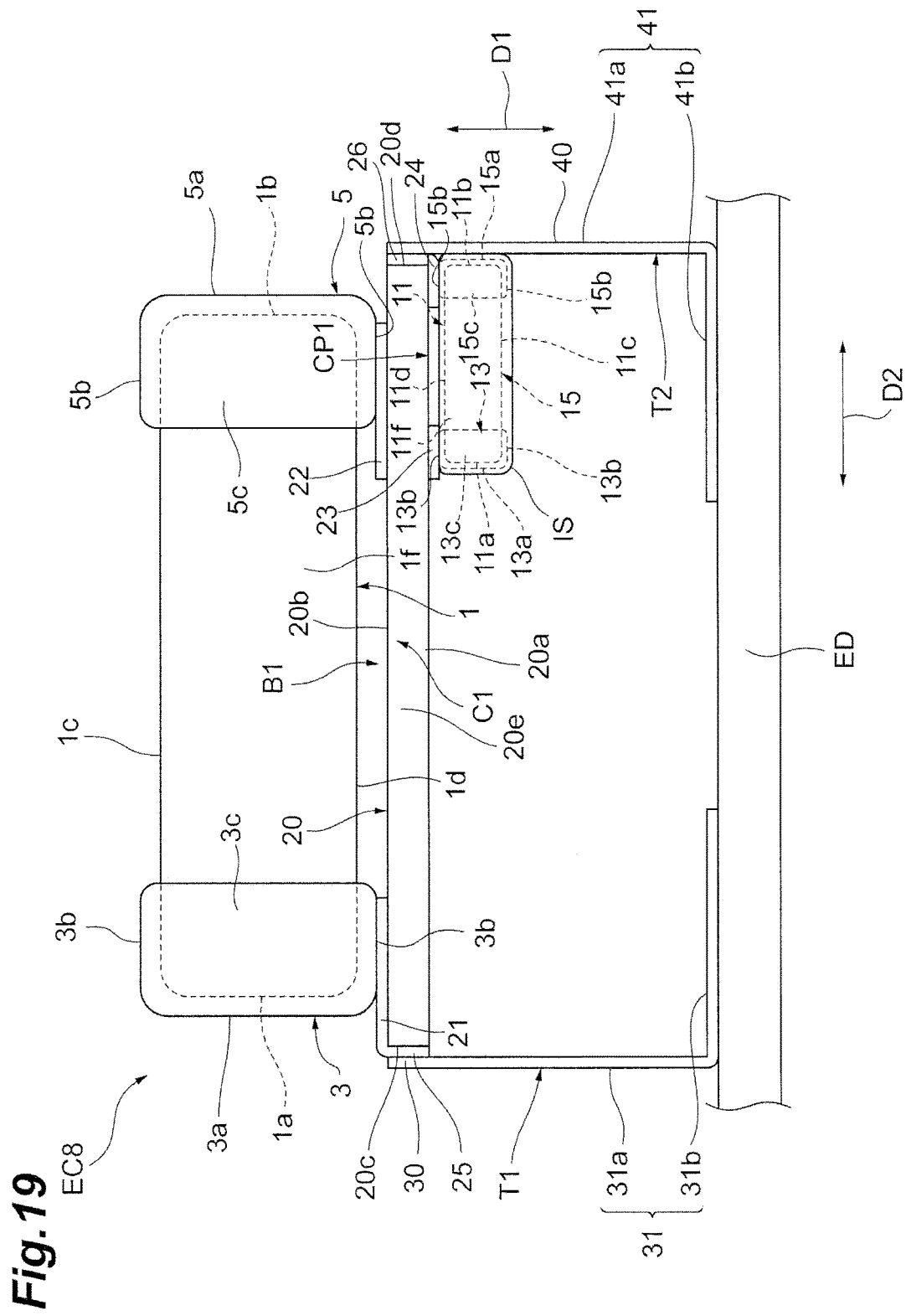
FIG. 19 is a side view illustrating an electronic component according to a modified example of the present embodiment.
Figure 20:
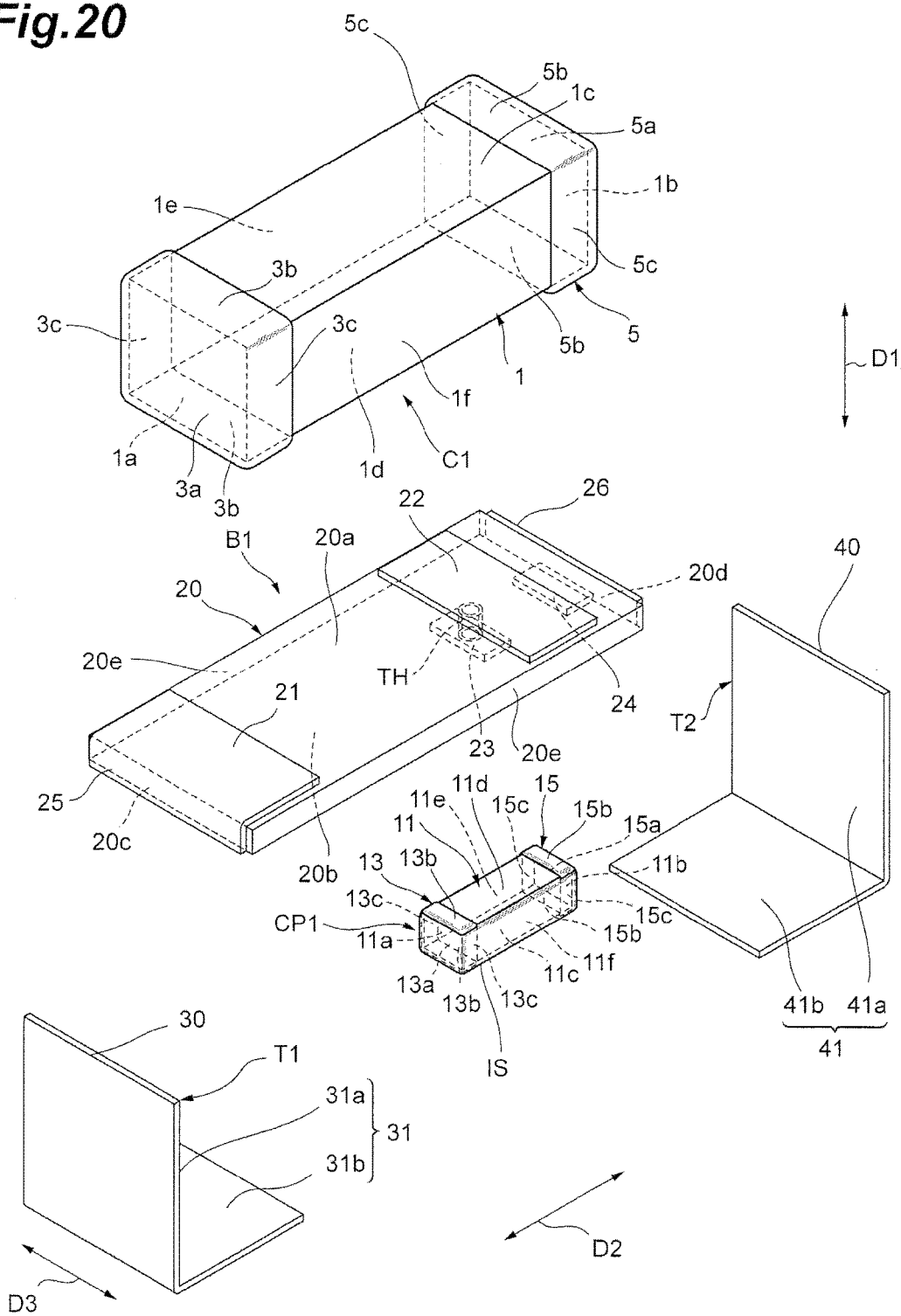
FIG. 20 is an exploded perspective view illustrating the electronic component according to the modified example.
Figure 21:
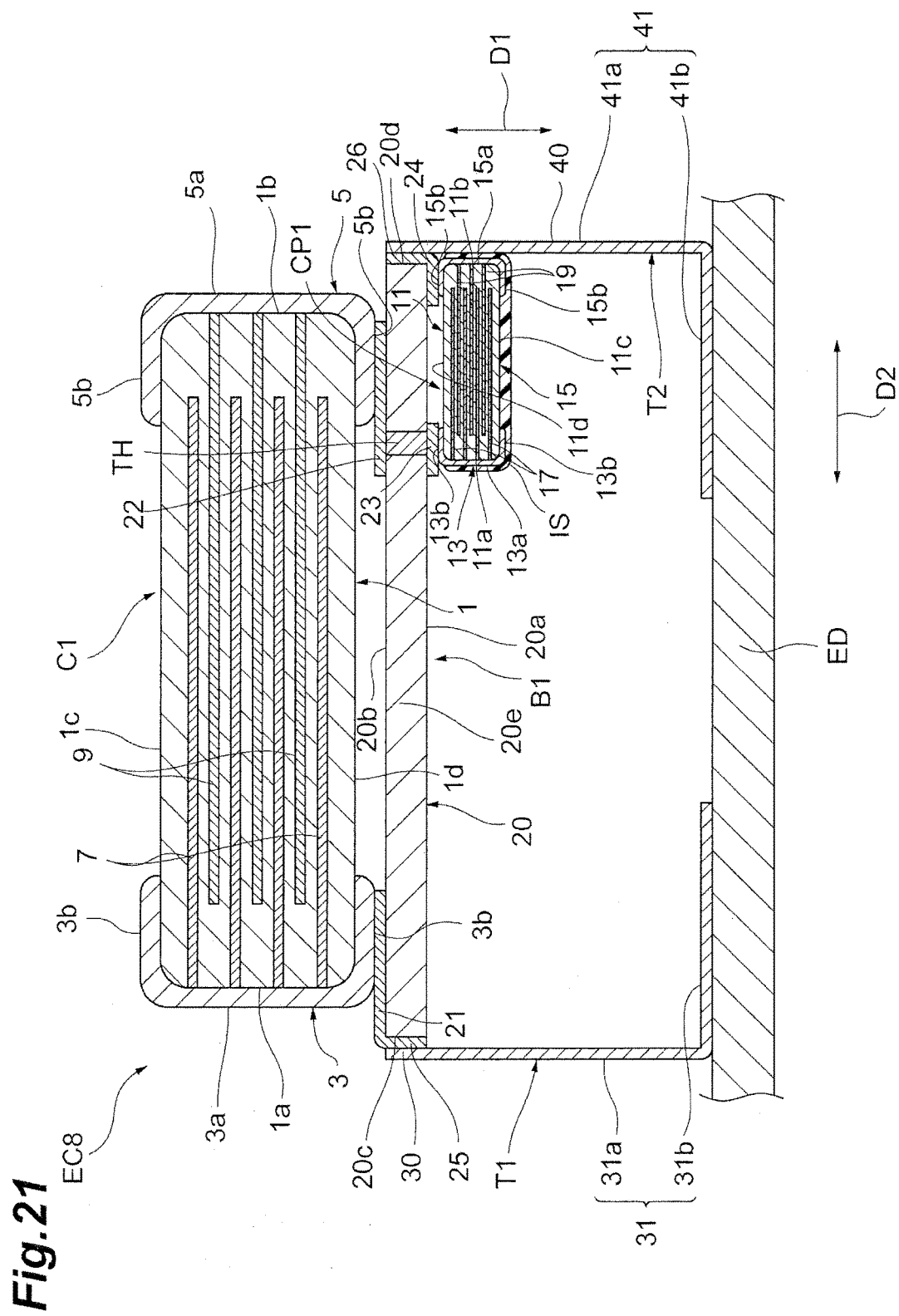
FIG. 21 is a diagram for illustrating a cross-sectional configuration of the electronic component according to the modified example.

Next, a configuration of an electronic component EC8 according to a modified example of the present embodiment will be described with reference to FIGS. 19 to 21. FIG. 19 is a side view illustrating the electronic component according to the modified example. FIG. 20 is an exploded perspective view illustrating the electronic component according to the modified example. FIG. 21 is a diagram for illustrating a cross-sectional configuration of the electronic component according to the modified example. The modified example differs from the modified example illustrated in FIGS. 16 and 17, in the configuration of an overcurrent protection device CP1.

As illustrated in FIGS. 19 to 21, the electronic component EC8 includes the multilayer capacitor C1, an overcurrent protection device CP1, the first substrate B1, the first metal terminal T1, and the second metal terminal T2. The overcurrent protection device CP1 includes the second element body 11, the third external electrode 13, the fourth external electrode 15, the plurality of third internal electrodes 17, the plurality of fourth internal electrodes 19, and the insulator IS.

The insulator IS covers the electrode portion 13a disposed on the third end surface 11a, the electrode portion 15a disposed on the fourth end surface 11b, the electrode portions 13b and 15b disposed on the side surface 11d, and the electrode portions 13c and 15c disposed on the side surfaces 11e and 11f. The insulator IS also covers a region on the side surface 11d that is exposed from the electrode portions 13b and 15b, and regions on the side surfaces 11e and 11f that are exposed from the electrode portions 13c and 15c. The electrode portions 13b and 15b disposed on the side surface 11c are exposed from the insulator IS. The region on the side surface 11c that is exposed from the electrode portions 13b and 15b is also exposed from the insulator IS.

In the electronic component EC8, the electrode portion 13b of the third external electrode 13 that is disposed on the side surface 11d, and the electrode portion 15b of the fourth external electrode 15 that is disposed on the side surface 11d are covered with the insulator IS. Thus, even if the overcurrent protection device CP1 falls, the insulator IS prevents the overcurrent protection device CP1 from contacting another region (first and second metal terminals T1 and T2, or the electronic device ED). As a result, when the overcurrent protection device CP1 falls, short circuit is difficult to occur. In the electronic component EC8, the electrode portions 13c of the third external electrode 13 that are disposed on the side surfaces 11e and 11f, and the electrode portions 15c of the fourth external electrode 15 that are disposed on the side surfaces 11e and 11f are also covered with the insulator IS. Thus, when the overcurrent protection device CP1 falls, short circuit is more difficult to occur.

Figure 22:
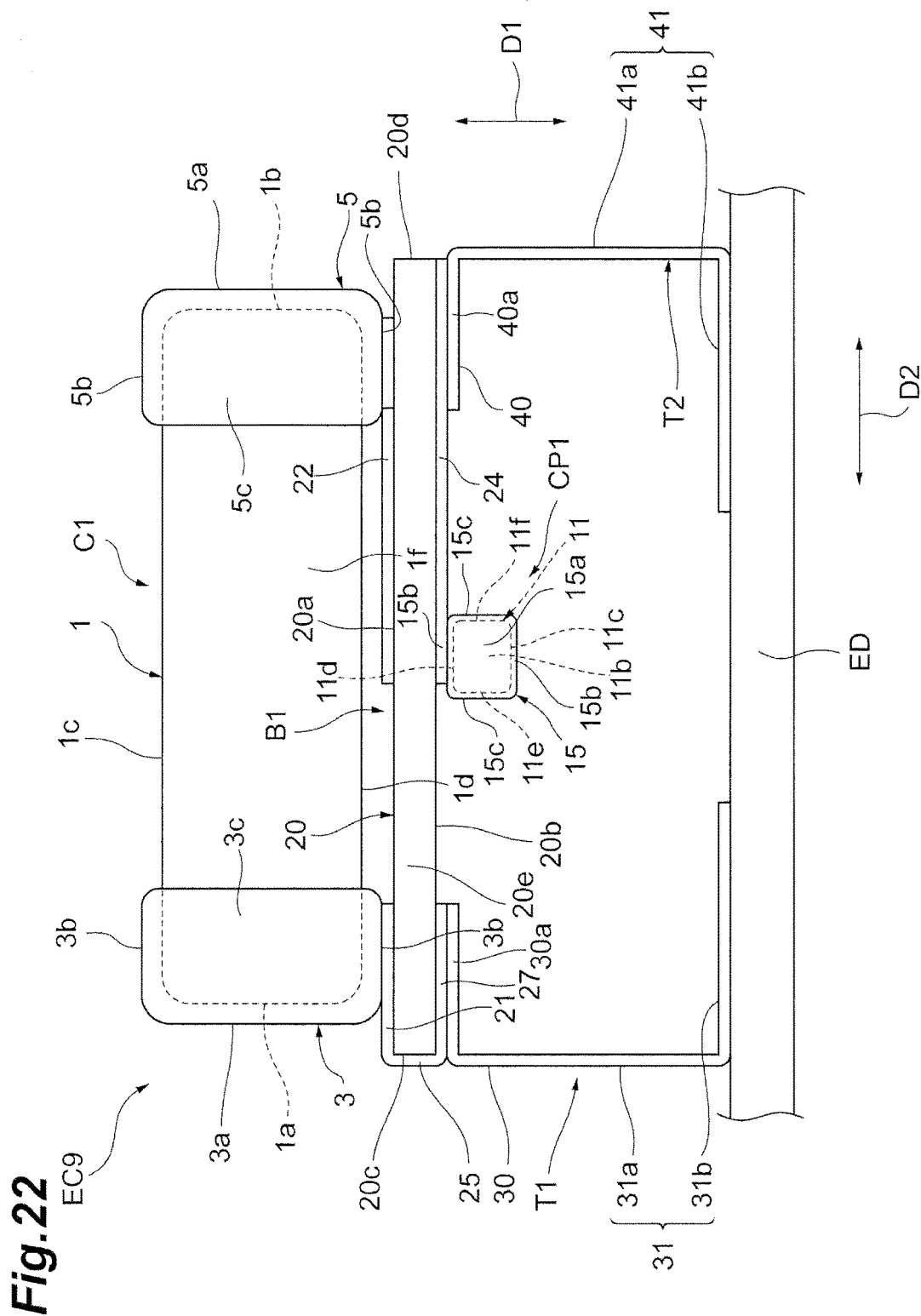
FIG. 22 is a side view illustrating an electronic component according to a modified example of the present embodiment.
Figure 23:
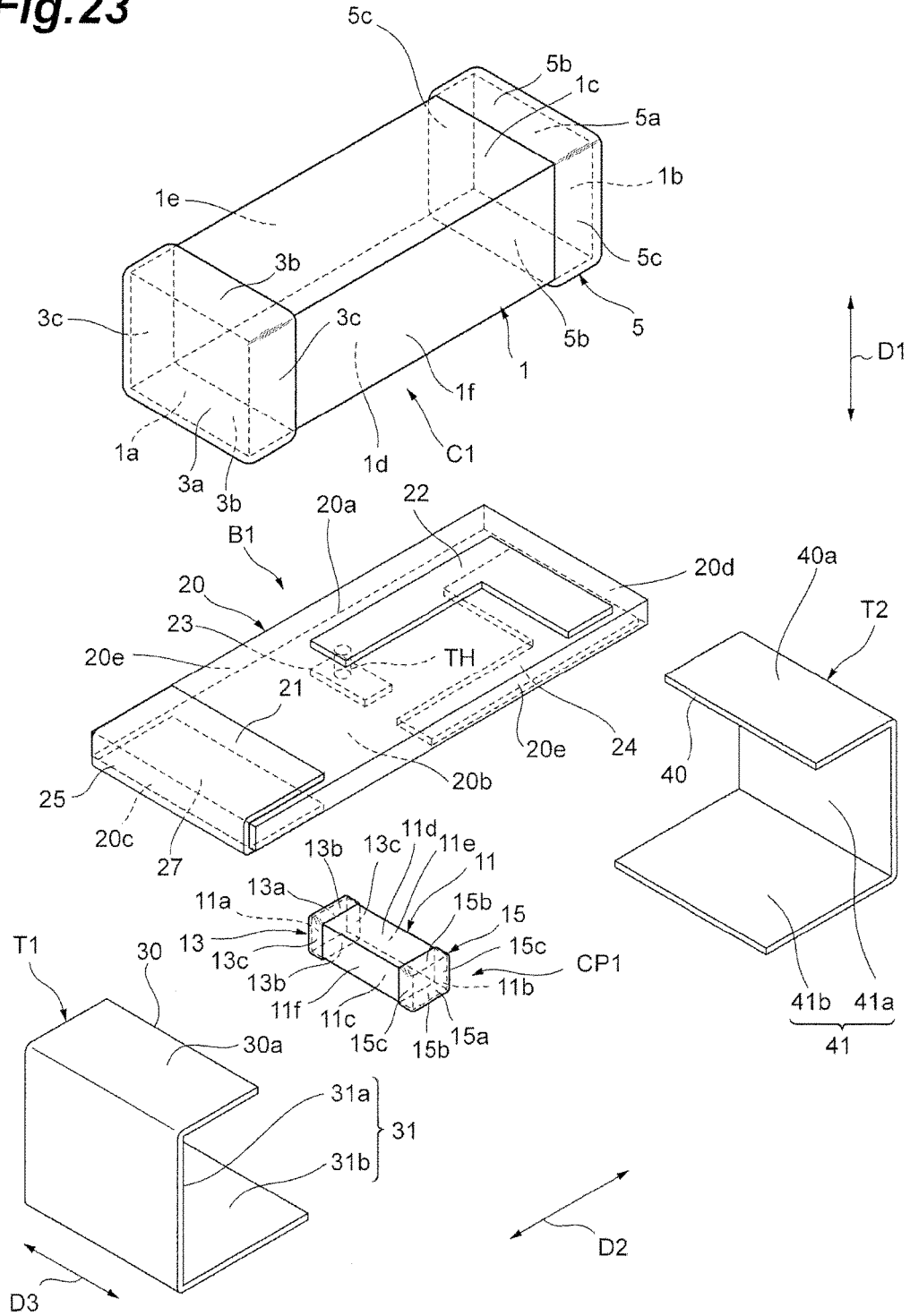
FIG. 23 is an exploded perspective view illustrating the electronic component according to the modified example.

Next, a configuration of an electronic component EC9 according to a modified example of the present embodiment will be described with reference to FIGS. 22 and 23. FIG. 22 is a side view illustrating the electronic component according to the modified example. FIG. 23 is an exploded perspective view illustrating the electronic component according to the modified example.

As illustrated in FIGS. 22 and 23, the electronic component EC9 includes the multilayer capacitor C1, the overcurrent protection device CP1, the first substrate B1, the first metal terminal T1, and the second metal terminal T2. The multilayer capacitor C1 and the overcurrent protection device CP1 are disposed in such a manner that the longitudinal direction of the first element body 1 and the longitudinal direction of the second element body 11 intersect with each other. In the modified example, the longitudinal direction of the first element body 1 and the longitudinal direction of the second element body 11 are orthogonal to each other. The longitudinal direction of the second element body 11 and the third direction D3 are the same.

In the modified example, the second direction D2 corresponds to the longitudinal direction of the multilayer capacitor C1 (first element body 1), and also corresponds to the width direction of the overcurrent protection device CP1 (second element body 11). The third direction D3 corresponds to the width direction of the multilayer capacitor C1 (first element body 1), and also corresponds to the length direction of the overcurrent protection device CP1 (second element body 11). The first direction D1 corresponds to the height direction of the multilayer capacitor C1 (first element body 1) and the overcurrent protection device CP1 (second element body 11).

The length in the third direction D3 of the overcurrent protection device CP1 is equal to or smaller than the length in the third direction D3 of the multilayer capacitor C1. The length in the longitudinal direction of the overcurrent protection device CP1 is equal to or smaller than the length in the width direction of the multilayer capacitor C1.

The first substrate B1 includes the substrate main body 20, the first connection electrode 21, the second connection electrode 22, the third connection electrode 23, the fourth connection electrode 24, the fifth connection electrode 25, a seventh connection electrode 27, and the through-hole conductor TH.

The seventh connection electrode 27 is disposed on the second principal surface 20b. The seventh connection electrode 27 is disposed closer to the side surface 20c than the center in the second direction D2 of the second principal surface 20b. One end in the second direction D2 of the seventh connection electrode 27 is positioned at an end on the side surface 20c side of the second principal surface 20b. On the second principal surface 20b, the seventh connection electrode 27 is separated from the third connection electrode 23 in the second direction D2.

The seventh connection electrode 27 is connected with the fifth connection electrode 25. The seventh connection electrode 27 and the fifth connection electrode 25 are connected to each other at a ridge line portion of the second principal surface 20b and the side surface 20c, and are electrically connected to each other. In the present embodiment, the seventh connection electrode 27 and the fifth connection electrode 25 are integrally formed.

The first metal terminal T1 includes a first connection portion 30 and a first leg portion 31. The first connection portion 30 includes a connection region 30a extending in the second direction D2. The connection region 30a extends also in the third direction D3, and has a rectangular shape when viewed from the first direction D1. The connection region 30a opposes the second portion 31b of the first leg portion 31 in the first direction D1. The connection region 30a opposes the seventh connection electrode 27 (second principal surface 20b). The connection region 30a opposes the first substrate B1 in the first direction D1.

The seventh connection electrode 27 is connected to the first metal terminal T1 (connection region 30a). The connection region 30a of the first connection portion 30 is directly fixed to one end portion side in the second direction D2 of the first substrate B1. The first metal terminal T1 is electrically connected with the first external electrode 3 of the multilayer capacitor C1 via the seventh connection electrode 27, the fifth connection electrode 25, and the first connection electrode 21. The connection region 30a and the seventh connection electrode 27 are connected to each other by, for example, a solder (not illustrated).

The second metal terminal T2 includes a second connection portion 40 and a second leg portion 41. The second connection portion 40 includes a connection region 40a extending in the second direction D2. The connection region 40a extends also in the third direction D3, and has a rectangular shape when viewed in the first direction D1. The connection region 40a opposes the fourth portion 41b of the second leg portion 41 in the first direction D1. The connection region 40a opposes the fourth connection electrode 24 (second principal surface 20b). The connection region 40a opposes the first substrate B1 in the first direction D1.

The fourth connection electrode 24 is connected to the second metal terminal T2 (connection region 40a). The connection region 40a of the second connection portion 40 is directly fixed to the other one end portion side in the second direction D2 of the first substrate B1. The second metal terminal T2 is electrically connected with the fourth external electrode 15 of the overcurrent protection device CP1 via the fourth connection electrode 24. The connection region 40a and the fourth connection electrode 24 are connected to each other by, for example, a solder (not illustrated).

In a state in which the first metal terminal T1 is fixed to the first substrate B1, the overcurrent protection device CP1 does not overlap the second portion 31b when viewed from the first direction D1. In a state in which the second metal terminal T2 is fixed to the first substrate B1, the overcurrent protection device CP1 does not overlap the fourth portion 41b when viewed from the first direction D1.

In the modified example, the connection region 30a of the first connection portion 30 is directly fixed to one end portion side in the second direction D2 of the first substrate B1, and the connection region 40a of the second connection portion 40 is directly fixed to the other one end portion side in the second direction D2 of the first substrate B1. Because the first metal terminal T1 and the second metal terminal T2 support the first substrate B1 from the second principal surface 20b side, the support strength of the first substrate B1 is high and the first substrate B1 can be prevented from falling.

In the modified example, the overcurrent protection device CP1 does not overlap the second portion 31b and the fourth portion 41b when viewed from the first direction D1. Even if the overcurrent protection device CP1 falls from the first substrate B1, there is a low possibility that the overcurrent protection device CP1 simultaneously contacts the first metal terminal T1 and the second metal terminal T2. Thus, the short circuit of the first metal terminal T1 and the second metal terminal T2 is suppressed.

In the modified example, the first element body 1 and the second element body 11 have a rectangular parallelepiped shape, and the overcurrent protection device CP1 is disposed closer to the first and second leg portions 31 and 41 than the first substrate B1. The length in the longitudinal direction of the overcurrent protection device CP1 is equal to or smaller than the length in the width direction of the multilayer capacitor C1. The multilayer capacitor C1 and the overcurrent protection device CP1 are disposed in such a manner that the longitudinal direction of the first element body 1 and the longitudinal direction of the second element body 11 intersect with each other. As a result, as compared with an electronic component in which a multilayer capacitor C1 and an overcurrent protection device CP1 are disposed in such a manner that the longitudinal direction of a first element body 1 and the longitudinal direction of a second element body 11 are parallel, in the electronic component EC9, the areas of the connection region 30a of the first connection portion 30 and the connection region 40a of the second connection portion 40 can be set to be larger, without increasing the size of the first substrate B1 when viewed from the first direction. Thus, in the electronic component EC9, the support strength of the first substrate B1 that is exerted by the first metal terminal T1 and the second metal terminal T2 can be enhanced.

In the modified example, as described above, the multilayer capacitor C1 and the overcurrent protection device CP1 are disposed in such a manner that the longitudinal direction of the first element body 1 and the longitudinal direction of the second element body 11 intersect with each other. As a result, in the electronic component EC9, as compared with an electronic component in which a multilayer capacitor C1 and an overcurrent protection device CP1 are disposed in such a manner that a longitudinal direction of a first element body 1 and a longitudinal direction of a second element body 11 are parallel, an interval between the third connection electrode 23 and the seventh connection electrode 27 can be set to be larger. Thus, in the electronic component EC9, the short circuit of the first metal terminal T1 and the overcurrent protection device CP1 is suppressed.

Figure 24:
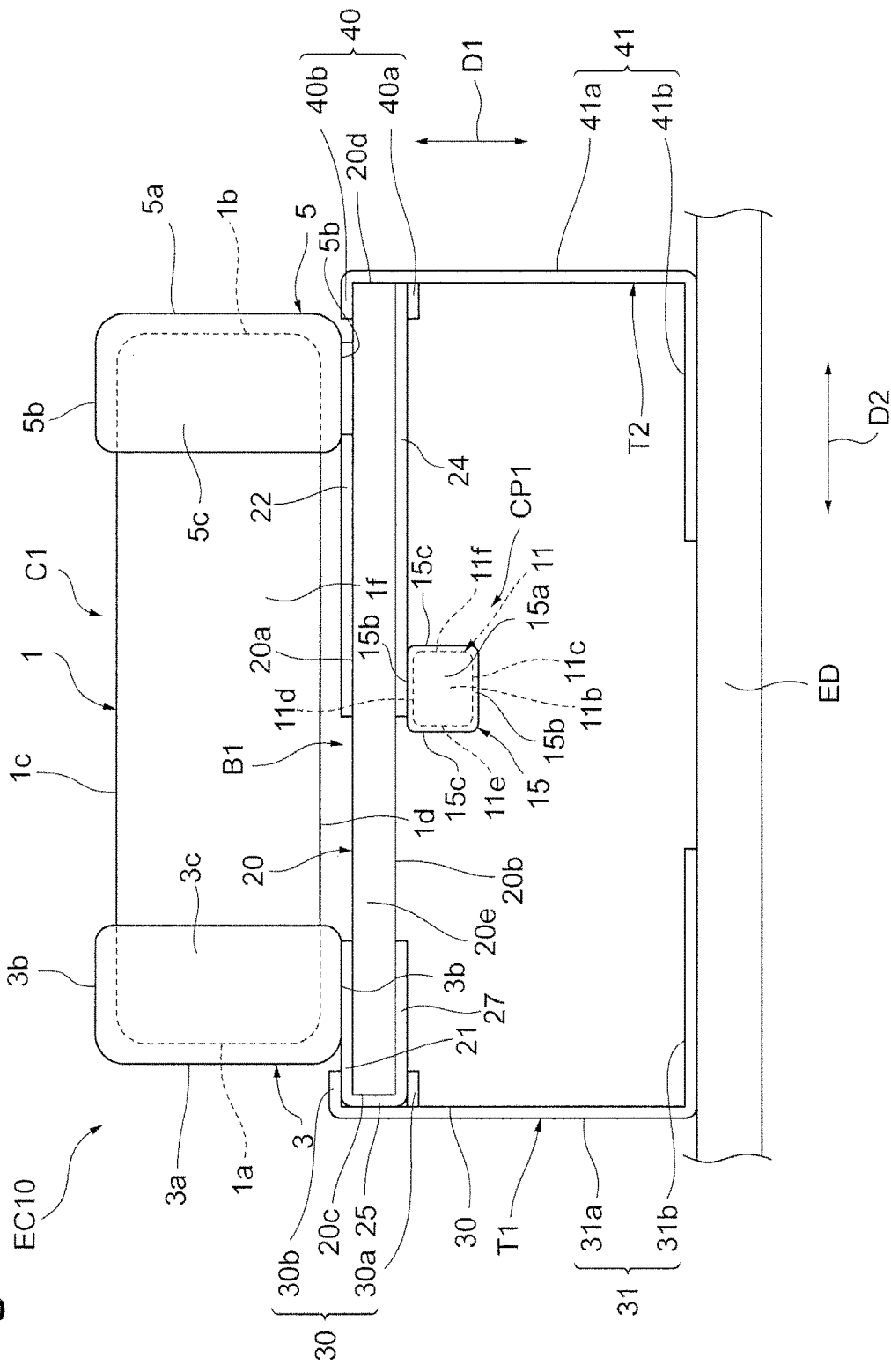
FIG. 24 is a side view illustrating an electronic component according to a modified example of the present embodiment.
Figure 25:
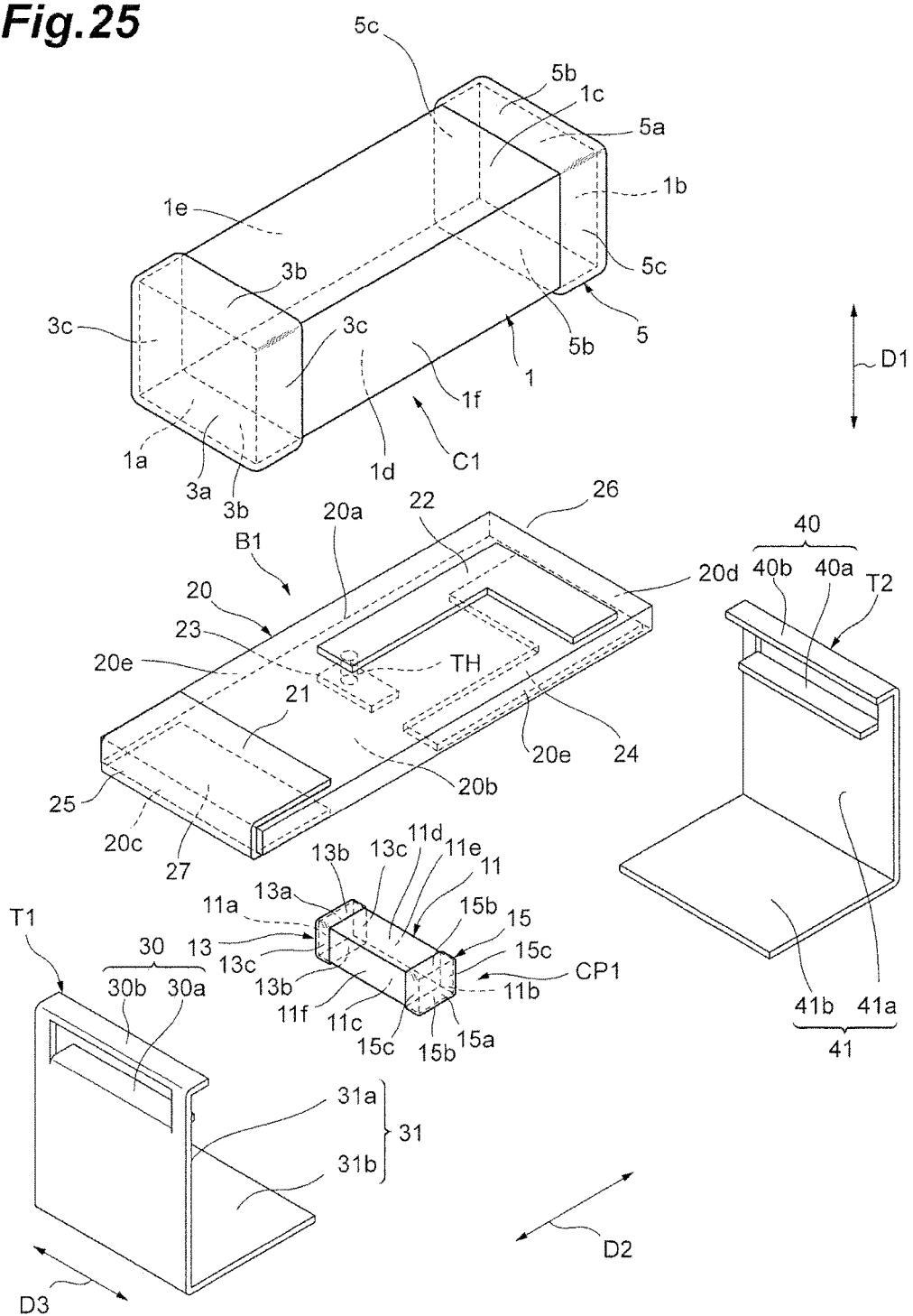
FIG. 25 is an exploded perspective view illustrating the electronic component according to the modified example.

Next, a configuration of an electronic component EC10 according to a modified example of the present embodiment will be described with reference to FIGS. 24 and 25. FIG. 24 is a side view illustrating the electronic component according to the modified example. FIG. 25 is an exploded perspective view illustrating the electronic component according to the modified example. The modified example differs from the modified example illustrated in FIGS. 22 and 23, in the configurations of a first metal terminal T1 and a second metal terminal T2.

As illustrated in FIGS. 24 and 25, the electronic component EC10 includes the multilayer capacitor C1, the overcurrent protection device CP1, the first substrate B1, a first metal terminal T1, and a second metal terminal T2. The multilayer capacitor C1 and the overcurrent protection device CP1 are disposed in such a manner that the longitudinal direction of the first element body 1 and the longitudinal direction of the second element body 11 intersect with each other. In the modified example, the longitudinal direction of the first element body 1 and the longitudinal direction of the second element body 11 are orthogonal to each other. The longitudinal direction of the second element body 11 and the third direction D3 are the same.

The first metal terminal T1 includes a first connection portion 30 and a first leg portion 31. The first connection portion 30 includes a pair of connection regions 30a and 30b extending in the second direction D2. Each of the connection regions 30a and 30b extends also in the third direction D3, and has a rectangular shape when viewed from the first direction D1. The connection regions 30a and 30b oppose each other in the first direction D1. An interval between the connection regions 30a and 30b in the first direction D1 is equivalent to a thickness of the first substrate B1 (the length in the first direction D1). The "equivalent" is not necessarily limited to an identical value. Even if a value contains a minute error within a preset range, a manufacturing error, or the like, the value may be regarded as equivalent.

The connection region 30a opposes the second portion 31b of the first leg portion 31 in the first direction D1. The connection region 30a opposes the seventh connection electrode 27 (second principal surface 20b). The connection region 30b opposes the first principal surface 20a.

One end portion in the second direction D2 of the first substrate B1 is fitted between the connection regions 30a and 30b. Thus, the first metal terminal T1 is directly fixed to the above-described one end portion side of the first substrate B1. The connection region 30a is connected to the seventh connection electrode 27. Thus, also in the modified example, the first metal terminal T1 is electrically connected with the first external electrode 3 of the multilayer capacitor C1 via the seventh connection electrode 27, the fifth connection electrode 25, and the first connection electrode 21. The connection region 30a and the seventh connection electrode 27 are connected to each other by, for example, a solder (not illustrated).

The second metal terminal T2 includes a second connection portion 40 and a second leg portion 41. The second connection portion 40 includes a pair of connection regions 40a and 40b extending in the second direction D2. Each of the connection regions 40a and 40b extends also in the third direction D3, and has a rectangular shape when viewed from the first direction D1. The connection regions 40a and 40b oppose each other in the first direction D1. An interval between the connection regions 40a and 40b in the first direction D1 is equivalent to a thickness of the first substrate B1.

The connection region 40a opposes the fourth portion 41b of the second leg portion 41 in the first direction D1. The connection region 40a opposes the fourth connection electrode 24. The connection region 40b opposes the first principal surface 20a.

The other one end portion in the second direction D2 of the first substrate B1 is fitted between the connection regions 40a and 40b. Thus, the second metal terminal T2 is directly fixed to the above-described other one end portion side of the first substrate B1. The connection region 40a is connected to the fourth connection electrode 24. Thus, also in the modified example, the second metal terminal T2 is electrically connected with the fourth external electrode 15 of the overcurrent protection device CP1 via the fourth connection electrode 24. The connection region 40a and the fourth connection electrode 24 are connected to each other by, for example, a solder (not illustrated).

In the modified example, one end portion of the first substrate B1 is fitted between the pair of connection regions 30a and 30b, and the other one end portion of the first substrate B1 is fitted between the pair of connection regions 40a and 40b. As a result, the first metal terminal T1 and the second metal terminal T2, and the first substrate B1 are surely fixed.

Figure 26:
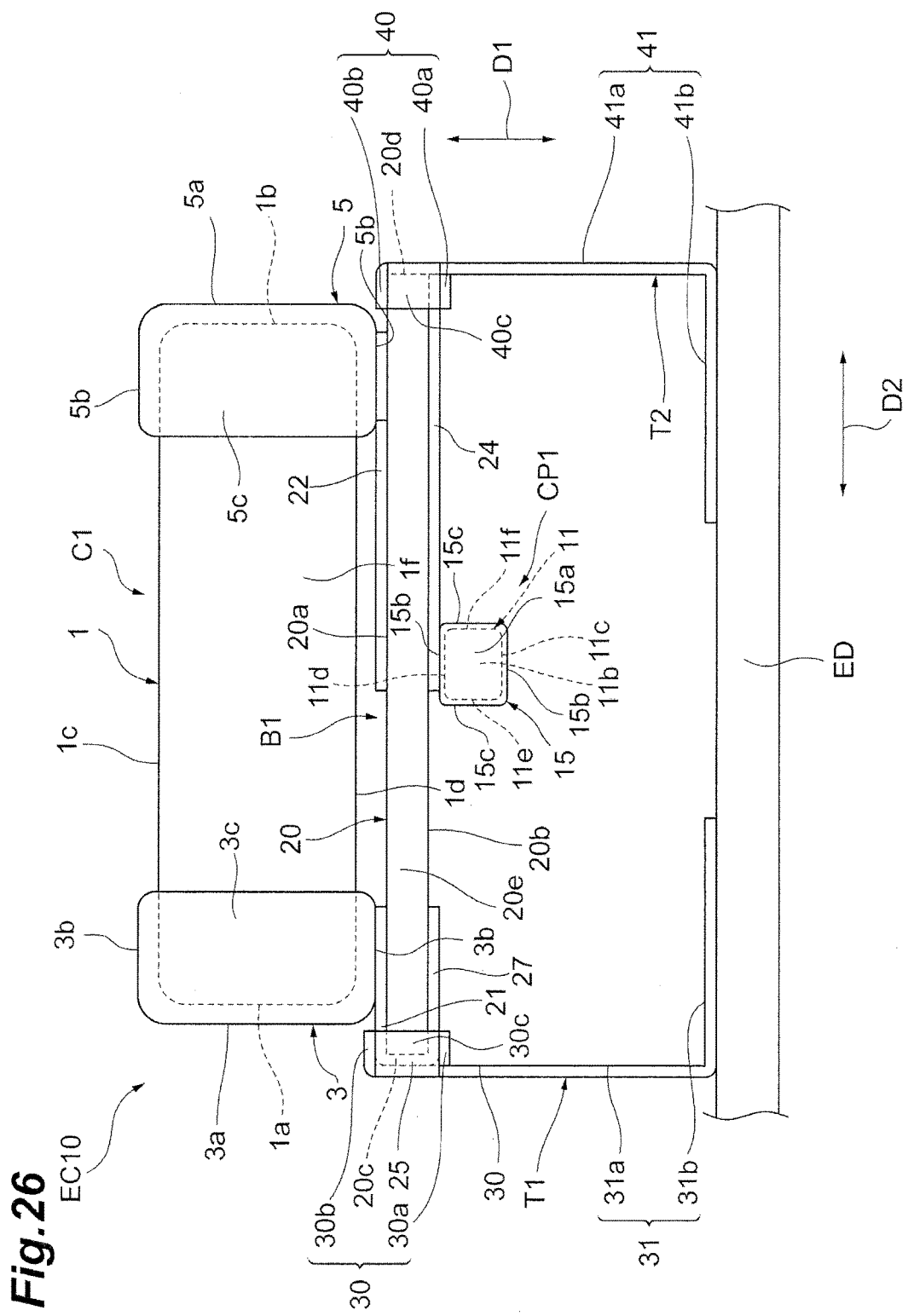
FIG. 26 is a side view illustrating an electronic component according to a modified example of the present embodiment.
Figure 27:
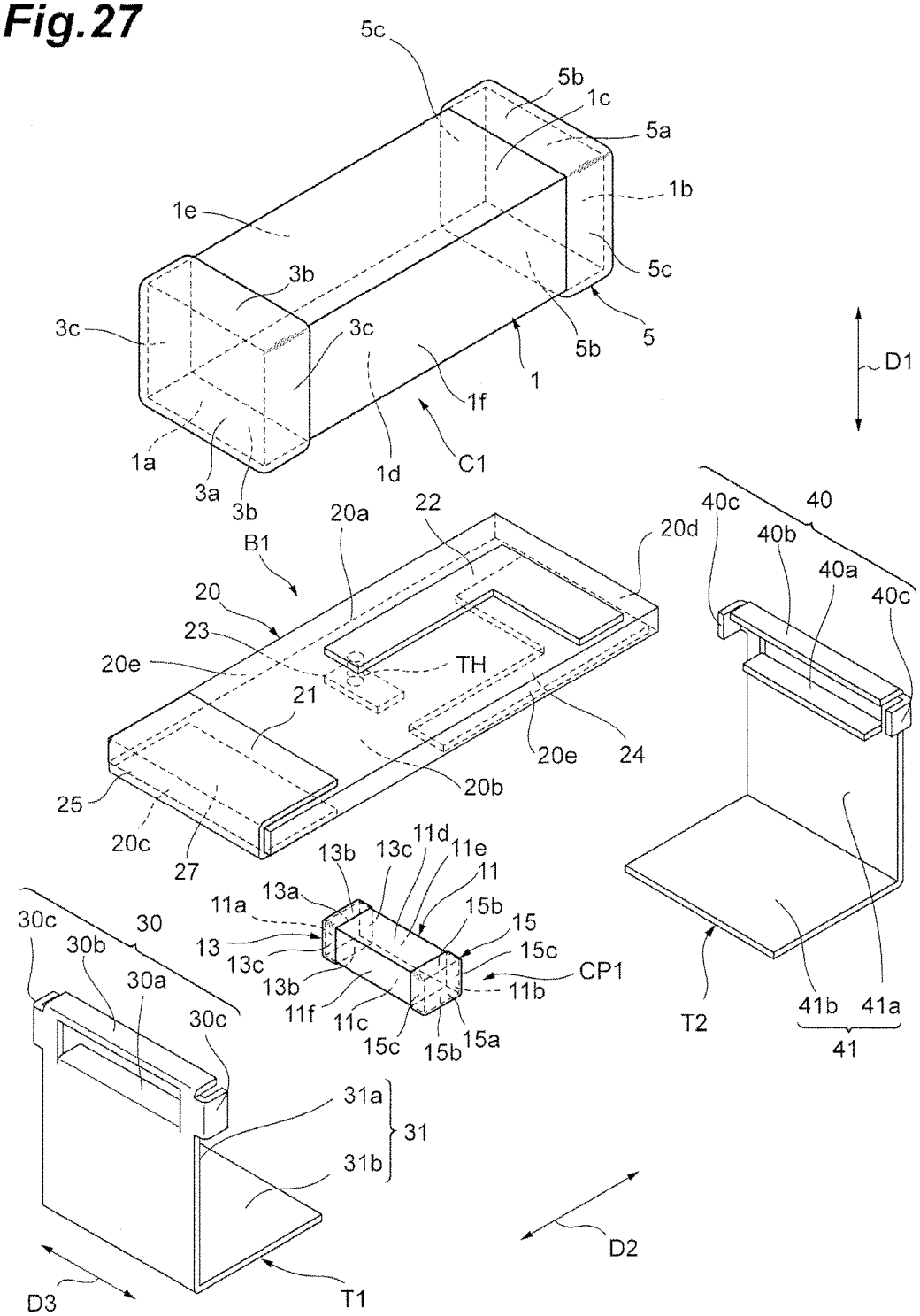
FIG. 27 is an exploded perspective view illustrating the electronic component according to the modified example.

Next, a configuration of a modified example of the electronic component EC10 will be described with reference to FIGS. 26 and 27. FIG. 26 is a side view illustrating the electronic component according to the modified example. FIG. 27 is an exploded perspective view illustrating the electronic component according to the modified example. The modified example differs from the modified example illustrated in FIGS. 24 and 25, in the configurations of a first metal terminal T1 and a second metal terminal T2.

The first connection portion 30 further includes a pair of connection regions 30c extending in the second direction D2. Each of the connection regions 30c extends also in the first direction D1, and has a rectangular shape when viewed from the third direction D3. The pair of connection regions 30c oppose each other in the third direction D3. An interval between the pair of connection regions 30c in the third direction D3 is equivalent to a width (length in the third direction D3) of the first substrate B1.

The second connection portion 40 further includes a pair of connection regions 40c extending in the second direction D2. Each of the connection regions 40c extends also in the first direction D1, and has a rectangular shape when viewed from the third direction D3. The pair of connection regions 40c oppose each other in the third direction D3. An interval between the pair of connection regions 40c in the third direction D3 is equivalent to a width (length in the third direction D3) of the first substrate B1.

One end portion in the second direction D2 of the first substrate B1 is fitted not only between the connection regions 30a and 30b but also between the pair of connection regions 30c. The other one end portion in the second direction D2 of the first substrate B1 is fitted not only between the connection regions 40a and 40b but also between the pair of connection regions 40c.

The embodiment of the present invention has been described above. The present invention, however, is not necessarily limited to the above-described embodiment, and various changes can be made without departing from the scope of the present invention.

In the electronic components EC1 to EC10, the multilayer capacitor C1 is larger than the overcurrent protection device CP1 or CP2. Nevertheless, the configuration is not limited to this. For example, the overcurrent protection device CP1 or CP2 may be larger than the multilayer capacitor C1.

In the electronic components EC1 to EC10, the second connection electrode 22 and the third connection electrode 23 are electrically connected to each other via the through-hole conductor TH. Nevertheless, the configuration is not limited to this. For example, the second connection electrode 22 and the third connection electrode 23 may be electrically connected to each other via a conductor disposed on the surface of the substrate main body 20.

The electronic components EC3 to EC10 may include the overcurrent protection device CP2 in place of the overcurrent protection device CP1.

The electronic component EC6 may include a second substrate directly fixed to the overcurrent protection device CP1. In this case, the overcurrent protection device CP1 is disposed between the second substrate and the first substrate B1 in the first direction D1. Because the electronic component EC6 includes the above-described second substrate, even if the overcurrent protection device CP1 falls, the second substrate prevents the overcurrent protection device CP1 from contacting another region. Thus, short circuit is difficult to occur.

In the electronic components EC9 and EC10, the multilayer capacitor C1 and the overcurrent protection device CP1 may be disposed in such a manner that the longitudinal direction of the first element body 1 coincides with the longitudinal direction of the second element body 11. For example, the multilayer capacitor C1 and the overcurrent protection device CP1 may be disposed in such a manner that the longitudinal direction of the first element body 1, the longitudinal direction of the second element body 11, and the second direction D2 are the same.

Figure 28:
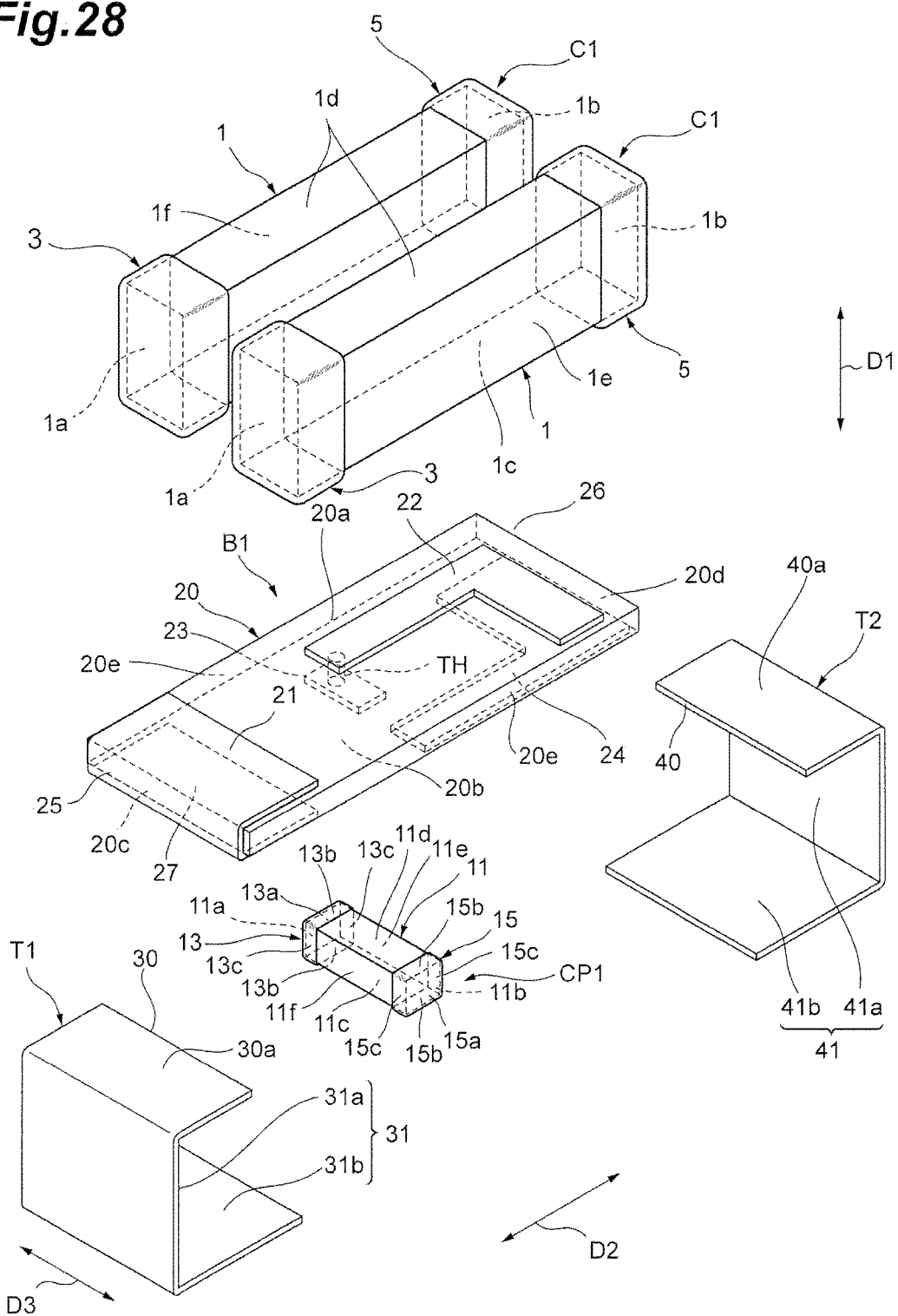
FIG. 28 is an exploded perspective view illustrating an electronic component according to a modified example of the present embodiment.

The electronic components EC1 to EC10 may include a plurality of multilayer capacitors C1. FIG. 28 illustrates an example. In the example illustrated in FIG. 28, for example, the electronic component EC6 includes two multilayer capacitors C1. Each of the multilayer capacitors C1 is connected to the first connection electrode 21 and the second connection electrode 22. The two multilayer capacitors C1 are connected in parallel between the first connection electrode 21 and the second connection electrode 22. The electronic component EC6 may include three or more multilayer capacitors C1.

The first connection portion 30 is directly fixed to one end portion side in the second direction D2 of the first substrate B1. Nevertheless, the configuration is not limited to this. For example, in the electronic component EC1 or EC3, the first connection portion 30 may be connected with the first external electrode 3 of the multilayer capacitor C1 without being connected with the fifth connection electrode 25. In other words, the first connection portion 30 is directly fixed to the first external electrode 3 of the multilayer capacitor C1. In this case, the first connection portion 30 is indirectly fixed to one end portion side in the second direction D2 of the first substrate B1. The first connection portion 30 is electrically connected with the first connection electrode 21 via the first external electrode 3.

In the overcurrent protection device CP2, the second element body 11 may include a hollow member having an internal space for storing an inner circuit element (the inner conductor 45). The third external electrode 13 and the fourth external electrode 15, and the inner circuit element may be integrally formed. In other words, by the third external electrode 13 and the fourth external electrode 15, and the inner circuit element being integrally formed, the third external electrode 13 and the fourth external electrode 15, and the inner circuit element may be connected to each other. In the overcurrent protection devices CP1 and CP2, the second element body 11 may have a circular cylindrical shape. In this case, the cylindrical surface of the second element body 11 constitutes a side surface.

What is claimed is:
1. An electronic component comprising:
a multilayer capacitor;
an overcurrent protection device;
a first substrate;
a first metal terminal; and
a second metal terminal,
wherein the multilayer capacitor includes:
a first element body;
a first internal electrode and a second internal electrode that are disposed in the first element body, and opposing each other;
a first external electrode disposed at one end portion of the first element body, and connected with the first internal electrode; and
a second external electrode disposed at another one end portion of the first element body, and connected with the second internal electrode,
wherein the overcurrent protection device includes:
a second element body;
a protection circuit element disposed in the second element body;
a third external electrode disposed at one end portion of the second element body, and connected with the protection circuit element; and
a fourth external electrode disposed at another one end portion of the second element body, and connected with the protection circuit element,
wherein the first substrate includes:
a substrate main body having a first principal surface and a second principal surface opposing each other in a first direction;
a first connection electrode disposed on the first principal surface, and connected with the first external electrode;
a second connection electrode disposed on the first principal surface, and connected with the second external electrode;
a third connection electrode disposed on the second principal surface, and connected with the third external electrode; and
a fourth connection electrode disposed on the second principal surface, and connected with the fourth external electrode; and
wherein the first metal terminal includes:
a first connection portion fixed to one end portion side of the first substrate in a second direction orthogonal to the first direction, and electrically connected with the first connection electrode; and
a first leg portion extending from the first connection portion,
wherein the second metal terminal includes:
a second connection portion fixed to another one end portion side of the first substrate in the second direction, and electrically connected with the fourth connection electrode; and
a second leg portion extending from the second connection portion,
wherein the multilayer capacitor is disposed on the first principal surface side of the first substrate, and the overcurrent protection device is disposed on the second principal surface side of the first substrate, and
wherein the second connection electrode and the third connection electrode are electrically connected to each other.

2. The electronic component according to claim 1, wherein the multilayer capacitor is disposed closer to the first and second leg portions than the first substrate, and
wherein the first external electrode is connected with the first leg portion.

3. The electronic component according to claim 1, wherein the overcurrent protection device is disposed closer to the first and second leg portions than the first substrate, and
wherein the fourth external electrode is connected with the second leg portion.

4. The electronic component according to claim 1, wherein one of the multilayer capacitor and the overcurrent protection device is smaller than another one, and
wherein the one of the multilayer capacitor and the overcurrent protection device is disposed closer to the first and second leg portions than the first substrate.

5. The electronic component according to claim 4, wherein the first leg portion and the second leg portion each include a mounted region extending in a direction in which the first leg portion and the second leg portion oppose each other, and
wherein the one of the multilayer capacitor and the overcurrent protection device does not overlap each of the mounted regions when viewed in the first direction.

6. The electronic component according to claim 1, wherein the first connection portion and the second connection portion each include a connection region that opposes the first substrate in the first direction and extends in a direction in which the first connection portion and the second connection portion oppose each other,
wherein the connection region of the first connection portion is fixed to the one end portion side of the first substrate, and wherein the connection region of the second connection portion is fixed to the other one end portion side of the first substrate.

7. The electronic component according to claim 6, wherein the first element body and the second element body have a rectangular parallelepiped shape,
wherein one of the multilayer capacitor and the overcurrent protection device is disposed closer to the first and second leg portions than the first substrate,
wherein a length in a longitudinal direction of the one of the multilayer capacitor and the overcurrent protection device is equal to or smaller than a length in a width direction of another one, and
wherein the multilayer capacitor and the overcurrent protection device are disposed in such a manner that a longitudinal direction of the first element body and a longitudinal direction of the second element body intersect with each other.

8. The electronic component according to claim 1, wherein the first connection portion and the second connection portion each include at least a pair of connection regions that oppose each other and extend in a direction in which the first connection portion and the second connection portion oppose each other,
wherein the one end portion of the first substrate is fitted between at least the pair of connection regions of the first connection portion, and
wherein the other one end portion of the first substrate is fitted between at least the pair of connection regions of the second connection portion.

9. The electronic component according to claim 8, wherein the first element body and the second element body have a rectangular parallelepiped shape,
wherein one of the multilayer capacitor and the overcurrent protection device is disposed closer to the first and second leg portions than the first substrate,
wherein a length in a longitudinal direction of the one of the multilayer capacitor and the overcurrent protection device is equal to or smaller than a length in a width direction of another one, and
wherein the multilayer capacitor and the overcurrent protection device are disposed in such a manner that a longitudinal direction of the first element body and a longitudinal direction of the second element body intersect with each other.

10. The electronic component according to claim 1, wherein the multilayer capacitor is disposed closer to the first and second leg portions than the first substrate,
wherein the first element body includes a first side surface opposing the first principal surface of the substrate main body, a second side surface opposing the first side surface in the first direction, and first and second end surfaces opposing each other in the second direction,
wherein the first external electrode includes electrode portions disposed on the first side surface, the second side surface, and the first end surface,
wherein the second external electrode includes electrode portions disposed on the first side surface, the second side surface, and the second end surface, and
wherein the electrode portion of the first external electrode that is disposed on the second side surface, and the respective electrode portions of the second external electrode that are disposed on the second side surface and the second end surface are covered with an insulator.

11. The electronic component according to claim 1, wherein the overcurrent protection device is disposed closer to the first and second leg portions than the first substrate,
wherein the second element body includes a third side surface opposing the second principal surface of the substrate main body, a fourth side surface opposing the third side surface in the first direction, and third and fourth end surfaces opposing each other in the second direction,
wherein the third external electrode includes electrode portions disposed on the third side surface, the fourth side surface, and the third end surface,
wherein the fourth external electrode includes electrode portions disposed on the third side surface, the fourth side surface, and the fourth end surface, and
wherein the respective electrode portions of the third external electrode that are disposed on the fourth side surface and the first end surface, and the electrode portion of the fourth external electrode that is disposed on the fourth side surface are covered with an insulator.

12. The electronic component according to claim 1, further comprising a second substrate fixed to one of the multilayer capacitor and the overcurrent protection device,
wherein the one of the multilayer capacitor and the overcurrent protection device is disposed closer to the first and second leg portions than the first substrate, and is disposed between the first substrate and the second substrate in the first direction, and
wherein the second substrate is separated from the first and second metal terminals.

13. The electronic component according to claim 1, wherein the second connection electrode and the third connection electrode are electrically connected to each other via a through-hole conductor penetrating through the substrate main body.

14. The electronic component according to claim 1, wherein the overcurrent protection device is a PTC thermistor, and includes at least a pair of internal electrodes opposing each other, as the protection circuit element,
wherein one of the internal electrodes is connected to the third external electrode, and
wherein another one of the internal electrodes is connected to the fourth external electrode.

15. The electronic component according to claim 1, wherein the overcurrent protection device is a fuse, and includes an inner conductor made of soluble metal, as the protection circuit element,
wherein one end portion of the inner conductor is connected to the third external electrode, and
wherein another one end portion of the inner conductor is connected to the fourth external electrode.

16. The electronic component according to claim 1, wherein the multilayer capacitor is larger than the overcurrent protection device.

17. The electronic component according to claim 1, wherein the multilayer capacitor and the overcurrent protection device overlap each other at least partially when viewed from the first direction.

* * * * *